United States Patent [19]

Peterson et al.

[11] Patent Number: 4,553,133
[45] Date of Patent: Nov. 12, 1985

[54] SERIAL FLOATING POINT FORMATTER

[75] Inventors: Robert D. Peterson, Plano; Wayne A. Penner, Farmers Branch, both of Tex.

[73] Assignee: Mobil Oil Corporation, New York, N.Y.

[21] Appl. No.: 417,922

[22] Filed: Sep. 14, 1982

[51] Int. Cl.[4] ............................................. G06F 3/00
[52] U.S. Cl. ............................. 340/347 DD; 235/310; 367/65; 367/74
[58] Field of Search ................................. 235/310, 311; 340/347 DD; 367/65, 66, 67, 74; 364/200, 900, 748

[56] References Cited

U.S. PATENT DOCUMENTS

| | | | |
|---|---|---|---|
| 3,626,167 | 12/1971 | Guck | 340/347 DD |
| 3,701,976 | 10/1972 | Shively | 364/200 |
| 3,875,344 | 4/1975 | Bogart | 340/347 DD |
| 3,930,232 | 12/1975 | Wallach | 235/310 |
| 3,961,170 | 6/1976 | De Sandre | 235/310 |

Primary Examiner—Charles D. Miller
Attorney, Agent, or Firm—A. J. McKillop; Michael G. Gilman; Frank J. Kowalski

[57] ABSTRACT

A floating point formatter for changing fixed point serial digital data, such as that received by a seismic data acquisiton system, is disclosed wherein fixed point serial digital data is received and scaled to remove any bias added by preamplification. The scaled data is shifted a predetermined number of bits and a resulting exponent is calculated. The shifted data signal and corresponding exponent are combined and further scaled to permit stacking the data without exceeding the system capacity.

13 Claims, 16 Drawing Figures

SERIAL FLOATING POINT FORMATTER

BACKGROUND OF THE INVENTION

The present invention pertains to floating point formatters and more particularly to floating point formatters that receive serial digital data.

Seismic data gathering may be done either on land or at sea. In either situation the basic process is the same. An acoustic energy source is used to generate seismic acoustic waves which travel through subterranean formations. Portions of these acoustic waves are reflected back to the surface by formation interfaces, that is, changes in density from one formation to an adjacent formation. Portions of these acoustic waves are also refracted by these interfaces, that is, travel along the interface before traveling back to the surface. Acoustic waves that are reflected or refracted back to the surface are detected by acoustic energy receivers. In some cases these may be a few as one receiver located many miles from the energy generators to detect refracted acoustic waves which travel along formation interfaces for great distances. Generally a string or line of acoustic energy receivers are laid along the ground for land surveys or towed by a marine vessel behind the acoustic energy sources for sea surveys. The line of acoustic energy receivers may be geophones, hydrophones, etc., and are spaced anywhere from seven to one hundred twenty feet apart.

Presently there exist many systems for collecting the data gathered by the line of acoustic energy detectors. However, as the number of acoustic energy detectors increases, the data gathered along with processing complexity increases accordingly. The prior art solution to increasing complexity has been to increase the size of the data processing unit or computer which records the data gathers.

Increasing the size of the processing unit does not solve many present problems and in some respects further complicates them. Many problems are emphasized by increasing the amount of data and the speed with which it is gathered. Input selection is done manually and with additional detectors, the selection is further complicated. Increased data input requires a multiplexed format which complicates transmission, reception and recordation. There is no intercommunication within the system between a compiler, such as a DFS V, unit and the processing computer, such as an SEL minicomputer. It is desirable to record the gathered data in a floating point format. This is presently done by software since a hardwired system to format the data in floating point does not exist in the prior art. In the accumulation of data, the time break window for arriving data is set in the hardware. This requires the setting of a window with hardwired delays in order to allow for a variable time break depending on the situation. If a change in the preset window is necessitated, the hardwired circuits must be changed.

Presently seismic data is received in serial format. The data is reformatted to a parallel format for further processing. This method is relatively slow and the size of the processing computer must be increased to accept a greater amount of input data resulting from an increased number of acoustic energy detectors.

In land seismic exploration, when an acoustic energy source is moved, the traces from the end detectors must be manually cancelled from the recorded seismic data to provide continuity in comparing data from one source to the other. This is an additional requirement of man hours and a waste of recording capability.

While seismic data is being gathered, the traces from each acoustic energy detector is monitored by an electrostatic camera. Normally if a noisy channel is suspected, an electrostatic "picture" of the trace must be taken and the input from that channel may be turned off. Unfortunately, the "picture" must be taken to be assured that a specific channel is noisy and the printing of such a record requires time. In processing, the seismic data is normally stacked and the recorded data will have the noisy data stacked with good or clean data until a decision to eliminate the noisy channel can be made.

SUMMARY OF THE INVENTION

The present invention provides a formatter which receives serial fixed point format digital data, shifts the digital data a predetermined number of bits, provides a hexadecimal point and computes the exponent of the shifted digital data. The output of the present invention is floating point serial digital data from an input of fixed point serial digital data.

DESCRIPTION OF THE PREFERRED EMBODIMENT

Figure 1:
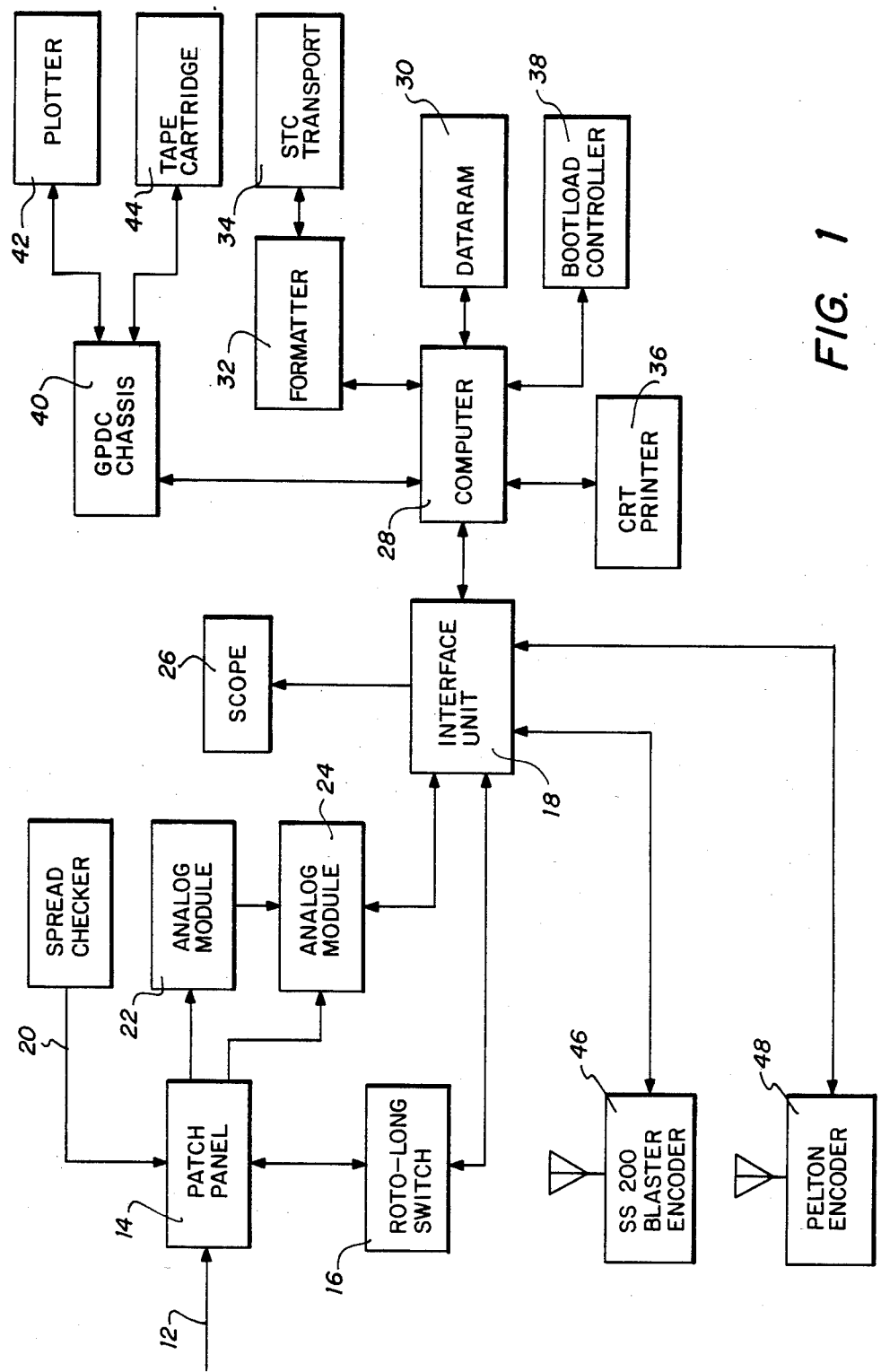
FIG. 1 is a block diagram of an overall data acquisition system.

Referring to FIG. 1, the seismic data acquisition of the present invention is illustrated in block form. The data is received through input line 12 to patch panel 14. Input line 12 may be a plurality of inputs from seismic cables which are connected to acoustic energy detectors. Patch panel 14 generally includes a plurality of plugboard receptacles to receive various inputs. Patch panel 14 feeds these inputs to rotalong controller 16 where specific inputs are selected and fed back to patch panel 14. In the preferred embodiment, inputs from two hundred forty seismic channels are received by patch panel 14 and fed to rotalong controller 16. Rotalong controller 16 selects aywhere from one to one hundred ninety-two of these inputs and feeds them back to patch panel 14. The quantity and specific inputs are selected through interface 18 (discussed infra). Rotalong controller 16 receives groups of channels from patch panel 14 and varies the groupings to be fed back to patch panel 14. Rotalong controller 16 permits the dropping of traces at one end of the line of acoustic energy detectors and picking up a trace at the other end. In seismic land operations, a long line of acoustic energy detectors, each producing a trace, are laid on the ground and the energy source moves along the acoustic energy detectors. The function of the rotalong controller 16 is to follow the energy source by dropping off traces at one end of the acoustic energy detectors and picking up traces in the direction that the energy sources move. Patch panel 14 is also connected to spread check 20 which monitors the inputs for broken wires and leakage. Spread checker 20 may also check traces that are not being recorded.

The input from rotalong controller 16 is fed through patch panel 14 to analog modules 22 and 24. The preferred embodiment, Texas Instrument's DFS V analog modules are preferred, however, any analog module may be used. Normally only certain channels may be sampled at certain specific periods of time and sample rates cannot be mixed when using Texas Instrument's DFS V analog modules, however, they are preferred due to their size and efficiency and their capability is greatly increased when used in conjunction with the present invention.

The processed data from analog modules 22 and 24 is fed through interface unit 18 which selects predetermined channels to be sampled, specific time when they should be sampled, and their sample rate mix. Interface unit 18 is connected to scope 26 which displays the data as it is acquired to permit monitoring of the various traces. Reception of the data by scope 26 permits a quick determination of whether clean or noisy data is being recorded. Any trace which is producing noisy data may be eliminated from the record being made, thus producing a more accurate seismic section when the data being recorded is stacked.

Interface unit 18 is connected to computer 28. All data acquisition parameters can be specified in interface unit 18 through software in computer 28. Prior art has required those specifications to be hardware functions of the controller box itself and any changes in recording configuration had to be made through hardware modifications. In the present application, building a different control list and sending it out to the device may be accomplished under software control. Interface unit 18 transmits data to computer 28, which formats the data and places it in mass memory 30. From solid state mass memory 30 the data is taken back by computer 28 and fed to formatter 32. Formatter 32 is an STC 1930 formatter which receives the data and reformats it into a GCR type format and outputs it to transport 34. Transport 34 is preferably an STC 1920 transport which records the data is a SISMO format at a rate of six thousand two hundred fifty BPI. However, formatter 32 and transport 34 may be of any type currently used in the art to format and record seismic data.

Computer 28 receives software command and all control through CRT printer 36 which is preferably a Hewlett Packard 2621 CRT/printer. The Hewlett Packard 2621 is a combination of a cathode ray tube keyboard interface and a thermal printer. The actual loading of the software program into the computer is usually accomplished by bootload controller 38. Also connected to computer 28 is GPDC chassis 40 which is also connected to plotter 42 and tape cartridge 44. Bootload controller 38 has other miscellaneous functions in which it can be used to accomplish functions within the computer.

Interface unit 18 also contains the control board for initiating blaster encoder 46 and pelton encoder 48.

Once the main program is loaded into the computer, recording parameters can be input from the tape cartridge 44 which is connected through the GPDC chassis.

In addition to scope 26, the data can also be correlated and plotted on plotter 42 as an additional quality control check. Plotter 42 can provide a hard copy of the seismic data being correlated and plotted.

Figure 2:
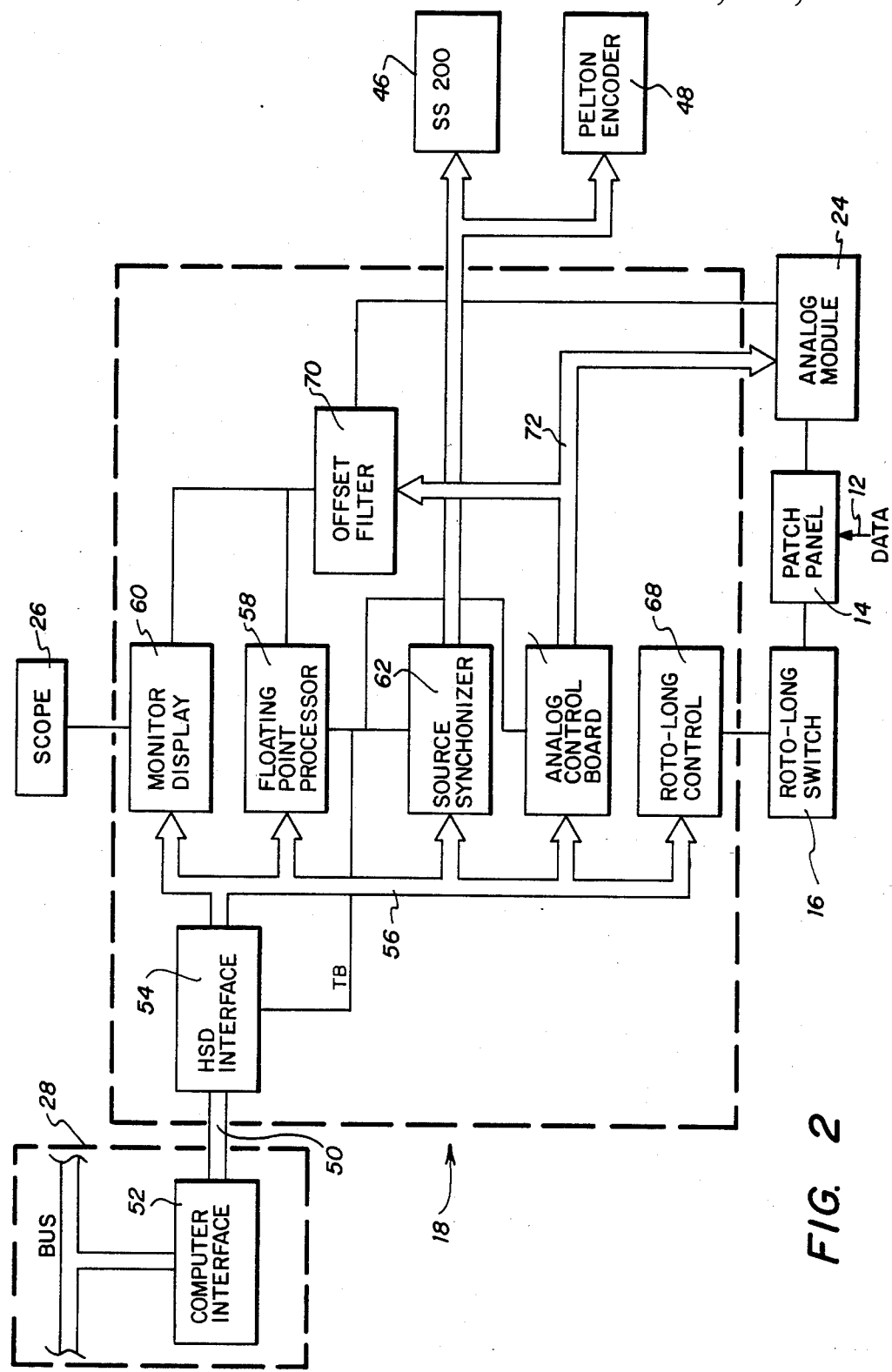
FIG. 2 is block diagram of the interface and control unit of the system of FIG. 1.

Referring to Fig. 2, interface unit 18 is illustrated in greater detail showing functions and interconnections in block form. Computer 28 is illustrated as connected to interface unit 18 through data bus 50. Data bus 50 connects computer interface 52, which is part of the computer, to HSD interface 54. HSD interface 54 is connected through FASTBUS 56 to floating point processor board 58, monitor display board 60, source synchronizer board 62, analog control board 66, and rotalong switch control board 68. Analog control board 66 is connected to DC offset filter board 70 and analog module 24 through control bus 72.

In operation all control to the intelligence units of interface 18, that is floating point processor board 58, monitor display board 60, source synchronizer board 62, analog control board 66 and rotalong switch control board 68 is conveyed through FASTBUS 56 from HSD interface 54. HSD interface 54 receives all instructions from computer 28 through data bus 50. FASTBUS 56 conveys command information from HSD interface 54 to the above mentioned intelligence units. HSD interface also uses FASTBUS 56 to request status reports from these unis. In the event of a status report request, floating point processor board 58, monitor display board 60, source synchronizer board 62, analog control board 66 and rotalong switch control board 68 will forward information to HSD interface 54. In addition, FASTBUS 56 will also convey data from floating point processor board 58 to HSD interface 54.

In operation computer 28 controls the entire seismic data gathering operation. Computer 28 will issue a command for initiation of seismic acoustic energy generation which will travel through data bus 50 to HSD interface 54. HSD interface 54 sends this command over FASTBUS 56 to source synchronizer board 62. Source synchronizer board 62 telemeters this information to the seismic acoustic energy generator which may be blaster encoder 46 or pelton encoder 48 which begins generating seismic acoustic energy. A line of acoustic energy detectors as previously described perceive the acoustic energy data in parallel analog form and convey this information detected data from all the channels in a line to rotalong controller 16. Rotalong controller 16 selects the desired channels as dictated by rotalong switch control board 68 and feeds the data from the selected channels back to patch panel 14. Patch panel 14 feeds the selected channel data to analog module 24. Analog module 24 accepts the parallel data, filters it and converts it to serial digital format and samples the data at a rate dictated by analog control board 66. The samples of the selected channel digitized data from analog module 24 are fed to DC offset filter board 70 which is also controlled by analog control board 66. At DC offset filter board 70 additional digital filtering and data processing takes place before the data is fed to floating point processor board 58 and monitor display board 60. The data fed to monitor display board 60 is translated to an x and y axis deflection and displayed on a cathode ray tube. The data fed to floating point processor board 58 is further modified and changed to a floating point format through the use of hard wire circuitry. The transform data from floating point processor board 58 is fed oer FASTBUS 56 to HSD interface 54 which then conveys this information to computer 28 through data bus 50.

Functions that are normally controlled by computer 28, such as, command information, device monitoring, etc. are transferred to interface unit 18 to permit greater data throughput without requiring an increase in the size of computer 28. Thus, a great savings in expense and space can be realized. Furthermore, interface unit 18 permits a faster data throughput to permit a more rapid collection of seismic data. This results in a tremendous time savings which permits the gathering of a greater amount of seismic data with less expense.

Figure 3:
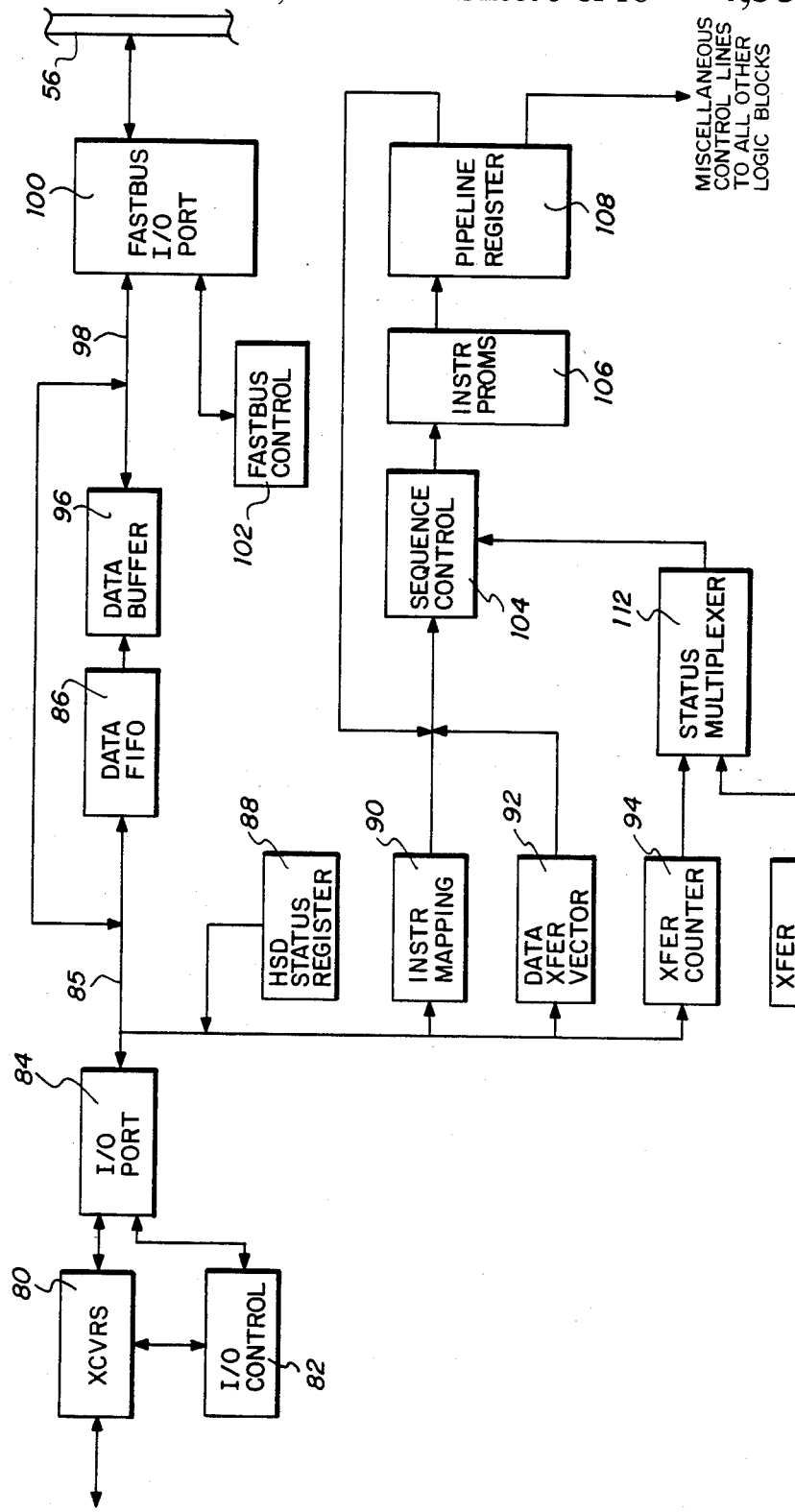
FIG. 3 is a block diagram of the HSD board of the control unit of FIG. 2.

Referring now to FIG. 3, HSD interface 54 is illustrated in greater detail in block form. HSD interface 54 is a synchronous interface having the capability of controlling various functions in the seismic data acquisition system. Transceiver circuit 80 receives an input from and forwards gathered data to computer 28 through bus 50. Transceiver circuit 80 has intercommunication connections to IO (input/output) control 82 and IO port 84 which have an intercommunication connection between each other. IO port 84 has an intercommunication connection 85 to data FIFO (First In-First Out) circuit 86 and provides an output for HSD status register 88; input to instruction mapping circuit 90, data transfer vector circuit 92, and transfer counter circuit 94. Data FIFO circuit 86 provides an input for a data buffer 96 which has an intercommunication connection 98 to IO port 100. An intercommunication is made between connection 85 and intercommunication connection 98. IO port 100 has intercommunication connections to FASTBUS 56 and to FASTBUS control circuit 102.

Instruction mapping circuit 90 provides an input to sequence control circuit 104 which provides an input to instruction PROM 106. Pipeline register 108 receives an input from instruction PROM 106 and produces an output to sequence control circuit 104. Transfer counter circuit 94 along with transfer request status circuit 110 provides input to status multiplexer 112 which along with data transfer vector circuit 92 provide inputs to sequence control circuit 104.

Data can move in either direction HSD interface to computer, or computer to HSD interface. There are three types of transfers that can be done.

The first type of transfer is a data transfer, either from computer 28 to HSD 54, or from HSD 54 to computer 28. On transfer to HSD 54, data is moved through transceiver 80 to IO port 84, and then over bus 85 to data FIFO 86. On transfer to computer 28, computer 28 will issue a command which is interpreted by instruction mapping circuit 90 HSD interface 54 to take either test or real data from data FIFO circuit 86 and transfer it back to computer 28. This is all done under sequencer control circuit 104 control, from bits of pipeline register 108. The data will be moved from the output of data FIFO circuit 86 through data buffer 96, to IO port 84. Real data is moved directly from buffer 96 to IO port 84. Test data is moed from buffer 96 to IO port 100, wrapped around the FASTBUS back to IO port 100, and then moved to IO port 84. The data sample is moved to IO port 84 under sequencer control circuit 104 control. A flag is raised to tell IO control 82 that is has to transfer the word back to computer 28. IO control 82 controls transmission of data back to computer 28 and moves the word back providing the appropriate control flags from computer interface 52 have been raised. Under data transfers, both to HSD interface 54 and to computer 28, the number of data samples to be transferred is usually included in the first command word. That information is loaded into transfer counter circuit 94. Transfer counter circuit 94 tells sequencer control circuit 104 the number of data words that have to be transferred in either direction from computer 28 to HSD interface 54 or from HSD interface 54 to computer 28. Each time a data word is moved transfer counter circuit 94 is decremented. When that count is equal to zero, sequencer control circuit 104 compares that to the flag which is sent over from computer 28 which would be input to the IO control logic 82 and compares the two to make sure that computer 28 reaches transfer count of 0 at the same time sequencer control circuit 104 reaches the transfer count of 0. If the two counts match then no error status is set but if there is a difference of opinion then an error status is set by transfer request status circuit 110 indicating the fact that the transfer count is different. HSD status register 88 indicates this status to computer 28.

The second type of transfer is command information from computer 28 to HSD interface 54 or other FASTBUS devices. Another type of command is a status request to boards, 58, 60, 62, 66 and 68. On a status request to boards 58, 60, 62, 66 and 68, the status command is sent out on FASTBUS 56 to the appropriate destination boards. The status command word is transferred to the selected board over FASTBUS 56 and the device will answer back with its own status word. This status word is loaded into FASTBUS IO port 100 board under control of FASTBUS control circuit 102. When FASTBUS IO port 100 is loaded, a status flag is set in status multiplexer 112 alerting sequencer control circuit 104 to the fact that it has received the FASTBUS IO word. The FASTBUS control bits are examined to determine whether it is a status word or data word. A status word is moved from FASTBUS IO port 100 around to the input of IO port 84 and the word will be transferred back to computer 28 under control of IO control 82.

The third type of transfer is data transfer to HSD 54 from floating point processor board 58. During the normal acquisition cycle, floating point processor board 58 is initialized to the desired floating point input format and it will sit in an idle mode awaiting timebreak. Upon the occurrence of the time break it will then start transfering data over FASTBUS 56 to HSD interface 54. FASTBUS control circuit 102 will load this data word into FASTBUS IO port 100 and also set the flag in transfer request status flag circuit 110 alerting sequencer control circuit 104 through status multiplexer 112 of that action. Sequencer control circuit 104 examines FASTBUS 56 control circuit 102, determines presence of a data sample and moves the data sample from FASTBUS IO port 100 to data FIFO circuit 86. Data is not moved to computer 28 but to data FIFO 86. Once the recording cycle is started and the floating point processor is moving data to HSD interface 54, the programmer then has to issue a data transfer command, from computer 28 to HSD interface 54. When HSD interface 54 receives a data transfer to CPU command it will then examine the FIFO data available flag and if there is data in data FIFO circuit 86 it will move it to the output of data FIFO circuit 86 through data buffer 96 to IO port 84 and IO control 82 will take the output of the IO port 84 and move it to tthe computer 28.

This actually is two separate transactions that occur on the seismic data from floating point processor board 58. The data gets moved into data FIFO circuit 86 and gets moved out of data FIFO circuit 86 to computer 28. The reason for doing this is to provide a buffer so that other operations may be executed during the recording cycle. Data FIFO circuit 86 is sixty four words deep and in the worst case acquisition rate, a data word is being transferred from floating point processor board 58 to HSD interface 54 every 7.8 microseconds. Other operations may be performed during the data acquisition cycle without losing data words because they are temporarily stored in data FIFO 86. For example, assume that 10 seconds of data are being recorded and for some reason, after 5 seconds of recording, the programmer wants to check the status of a particular FASTBUS device. He will stop acquiring data and go out and do a status request which will be returned via the route previously described and the data, instead of being lost, will be moved into data FIFO 86. After the status request is completed the program will then issue another data transfer command. HSD interface 54 will resume moving data from the output of data FIFO circuit 86 to computer 28.

The input to transceiver circuit 80 is a thirty-two bit data word from the computer interface 52. The data can flow in two directions, from computer interface 52 to transceiver circuit 80 and from transceiver circuit 80 to computer interface 52. Transceiver circuit 80 is a bidirectional gate which either allows data to flow to HSD interface 54 or data and status information back to computer 28. When data flows from computer 28 to HSD interface 54, it passes through transceiver circuit 80 and is input into IO port 84 under control by IO control 82. The loading of IO port 84 with data and status information and also the unloading of IO port 84 of data from computer 28 is done under microcode control which is determined by the sequencer address. The sequence control lines are output from sequencer control circuit 104. Hardware logic conditions generate status flags in transfer request status circuit 110, which feeds status multiplexer 112. Status multiplexer 112 is controlled by bits from pipeline register 108 which allows it to select any one of sixteen status lines to be input to sequencer control circuit 104 for conditional operations. When a data word is loaded into IO port 84 a status flag is set alerting sequencer control circuit 104 of that function and sequencer control circuit 104 will take the appropriate action. Sequencer control circuit 104 determines what to do with the data sample by examining two registers. The first one is instruction mapping circuit 90 and a second one is data transfer vector circuit 92. The data that is received from IO port 84 can have various destinations. For one, it could be test data bound for interface 54 itself or it could be command information bound for boards 58, 60, 62, 66, or 68 or it could be a bit pattern which signifies a status request to HSD interface 54. HSD interface 54 determines what kind of operation has to be performed by examining instruction mapping circuit 90.

There are other control lines which are used during the data transfer, basically recognition lines which tell sequencer control circuit that it may perform the approprite type of data transfer and examination of these recognition status lines is done by data transfer vector circuit 92. Sequencer control circuit 104 is alerted to the fact that action is called for by receiving a data word from computer 28. Sequencer control circuit 104 examines instruction mapping circuit 90 and data transfer vector circuit 92 to determine exactly what to do with it. Under normal operations, if it is command bound for boards 58, 60, 62, 66 or 68, sequencer control circuit 104 will take the output of IO port 84 and route it to FASTBUS IO port 100. This is done under the control of sequencer control circuit 104 with bits that are set with pipeline register 108. The word is then moved and loaded into FASTBUS IO port 100 and along with the data word or command, the approprite FASTBUS control bits are set by FASTBUS control circuit 102. FASTBUS control circuit 102 generates a FASTBUS access request and transfers that data or command to the proper destination.

Figure 4:
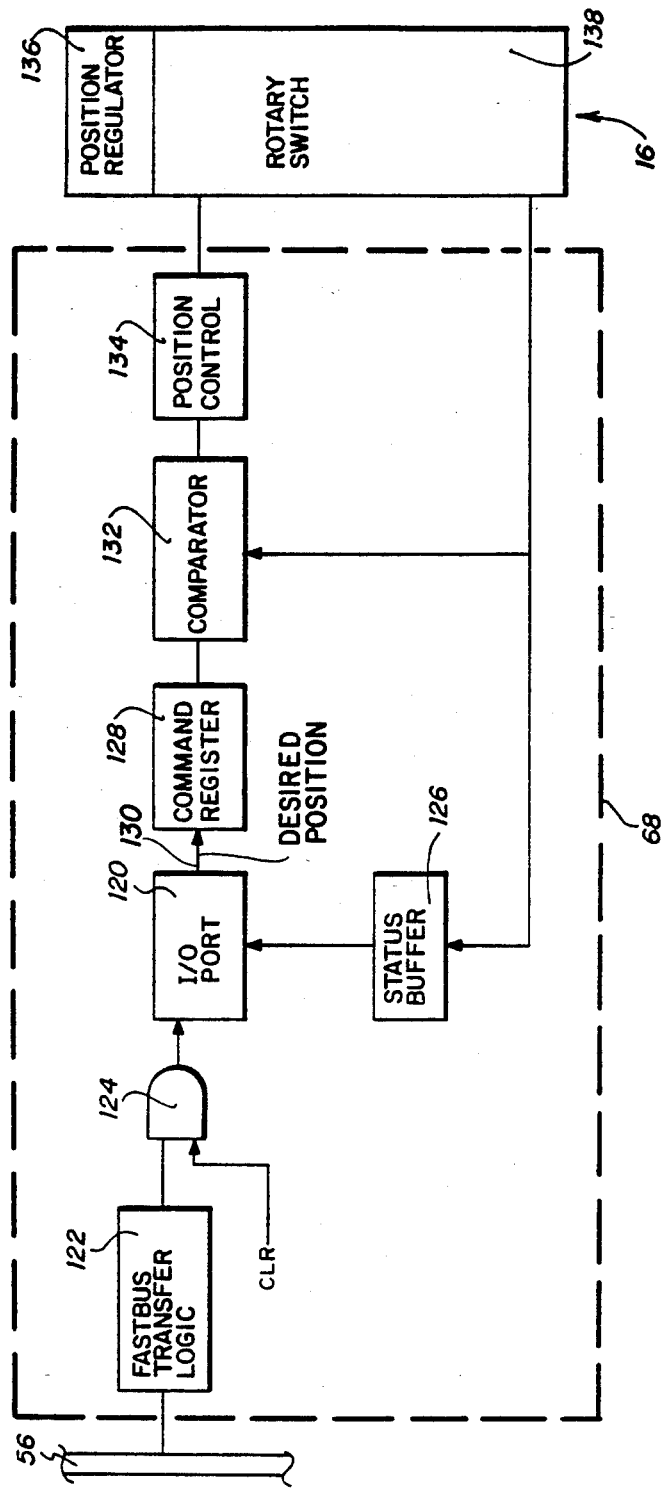
FIG. 4 is a block diagram of the rotalong control board of FIG. 2.

Referring now to FIG. 4 the circuitry for rotalong switch control board 68 is illustrated in block form. Input port 120 receives inputs from FASTBUS 56 through logic circuit 122 and gate circuit 124 and from status buffer circuit 126. Command register 128 receives an input from IO port 120 and the desired position of rotary switch 16 from connection line 130. The desired position from command register 128 is fed through comparator circuit 132 to position control circuit 134. Position control circuit 134 issues the command to position regulator circuit 136 of rotary switch 138. Rotary switch 138 feeds the actual position information to comparator circuit 132 where the desired position of rotary switch 138 as indicated by command register 128 is compared to its actual position to determine whether it is properly aligned. All data is input to rotary switch 138 from patch panel 14 and after predetermined channels are selected, returned to patch panel 14.

Rotalong controller 16 receives command information from computer 28 through interface unit 18. Rotary switch 138 is commanded to select an input channel to be input to analog modules 22 and 24 through patch panel 14. Status buffer circuit 126 which is connected to input/output port 120 contains the status or rotary switch 138. Status buffer circuit 126 will report as part of its status word the rotary switch current location and which input is connected to the first channel of the switch. Command register 128, which receives the data from input/output port 120 receives its command as to the desired position of rotary switch 138 from computer 28 through interface unit 18. Command register 128 feeds this information to comparator circuit 132 which also receives the position of rotary switch 139. Comparator circuit 132 compares the desired position of rotary switch 138 with its actual position. The result of this comparison wil cause a stepping command, either in the forward or reverse direction, depending upon which direction rotary switch 138 must move to coincide with the desired position command issued by computer 28.

This is accomplished by specifying which channel is to be selected as the first input to analog modules 22 and 24.

Command register 128, comparator circuit 132 and position control circuit 134 determine whether rotary switch 138 is in a position coinciding with the commanded position from computer 28. Whenever rotary switch 138 is not in a position coinciding with the commanded position, a command is issued to position regulator circuit 136 to either advance or retard the position of rotary switch 138. Rotary switch 138 may be of any type of electro-mechanical switches currently used in the art. This normally consists of an inner wheel of contacts corresponding to each position of input data and a series of fixed contacts on the outer periphery of the switch, each corresponding to a data output position. By rotating the inner wheel of contacts with respect to the series of fixed contacts corresponding to output positions, the input for the first output position may be varied accordingly.

When the position of rotary switch coincides with the commanded position, data is output to patch panel 14. Thus, a plurality of inputs, such as two hundred forty inputs from each of two hundred forty acoustic pulse detectors may be fed into rotalong controller 16. A predetermined number of the two hundred forty inputs may be selected to produce a desired configuration with respect to an acoustic energy generator. Unwanted or extraneous data may be eliminated to reduce the load on analog modules 22 and 24.

Figure 5:
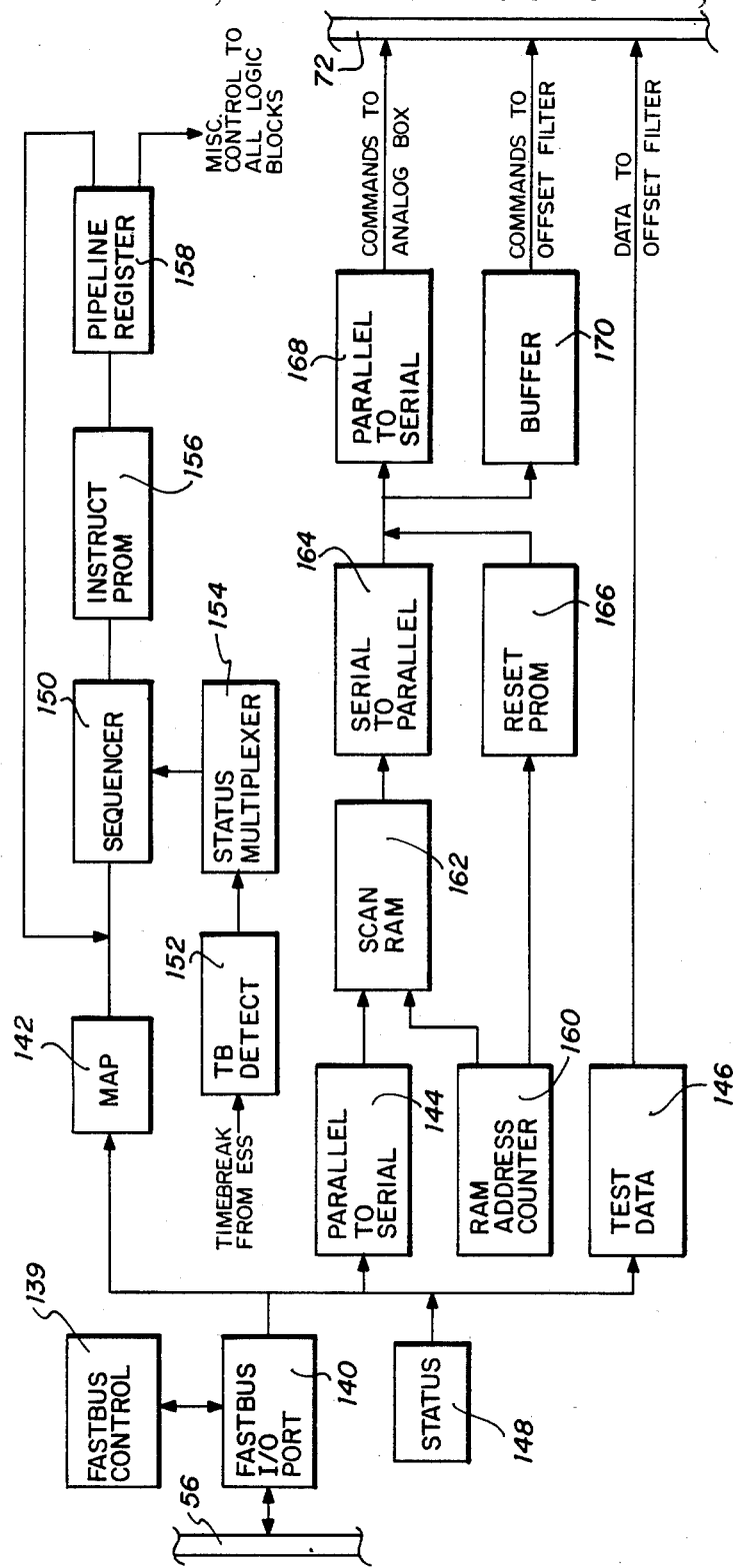
FIG. 5 is a block diagram of the analog control board of FIG. 2.

Referring now to FIG. 5, analog control board 66 is illustrated in block form. FASTBUS control 139 has an intercommunication connection to FASTBUS IO port 140. FASTBUS IO port 140 feeds map circuit 142, parallel to serial convertor 144, test data circuit 146 and status circuit 148. Map circuit 142 provides an input to sequencer 150 which also receives a signal from a status multiplexer 154 provided by time break detection circuit 152. Sequencer 150 provides an input to instruction PROM 156 which feeds pipeline register 158. Parallel to serial convertor 144 and RAM address counter 160 provide inputs to SCAN RAM 162 which provides an input to serial to parallel convertor 164. RAM address counter 160 also provides an input to reset PROM 166 which together with serial to parallel convertor 164 provide inputs to parallel to serial convertor 168 and buffer circuit 170. Parallel to serial convertor 168 provides commands to analog modules 22 and 24 through DATABUS 72 while buffer circuit 170 provides commands to offset filter 70 through DATABUS 72. Test data circuit 146 provides data to offset filter 70 through DATABUS 72 under test conditions. Pipeline register 158 provides miscellaneous control signals to all portions of analog control board 66.

The basic function of analog control board 66 is to provide control information to analog modules 22 and 24 and DC offset filter board 70. The command information for analog control board 66 is sent to it from computer 28 through HSD interface 54 through FASTBUS 56. The thirty-two bit control words are loaded into FASTBUS IO port 140 and a flag is set which alerts sequencer 150 that it has received a command. The flag is input to sequencer 150 through the status multiplexer 154. When sequencer 150 is alerted to the fact that it received a command it will then examine mapping register 142 to determine what kind of command it has received. The output of mapping register 142 will provide an address which is the start of the appropriate routine to handle the command that it has received. The output of mapping register 142 provides a starting address which is input to sequencer 150. There are two types of commands that analog control board 66 will receive. The first one is a load SCAN RAM 162 command.

Scan ram 162 has two hundred fifty-six locations, each comprises one thirty-two bit analog module command. The thirty-two bit word is written and read out of SCAN RAM 162 in serial format. Scan ram 162 is the source of command information for analog modules 22 and 24. There are also provisions for analog control board 66 to provide command information to analog module 22 and 24 when the system is first powered up. Reset PROM 166 contains what is called the default scan configuration. Each location within reset PROM 166 consists of a command for analog modules 22 and 24. When the system is powered up or reset, reset PROM 166 is used as a source for the analog module command.

The output of SCAN RAM 162 is through serial to parallel converter 164, through parallel to serial converter 168 to control bus 72. One of the sources for parallel to serial converter 168 is reset PROM 166. Under reset conditions, the output of reset PROM 166 is loaded into the parallel to serial converter 168. The data moves out of reset PROM 166 as a thirty-two bit parallel word, loaded into parallel to serial converter 168 and sent out to analog modules 22 and 24 as a serial command word. At the same time that this command information is being transferred to analog modules 22 and 24, it also has to be transferred to DC offset filter board 70. In DC offset filter board 70 implementation, each channel has a memory location dedicated to it to be used in running average filter process. For that process to work properly, the data samples that are generated by a particular command have to be associated with the address within that command of the memory location on DC offset filter board 70. As the command information is being shifted out to analog module 22 and 24 which will generate a data sample, the same information is being transferred through buffer circuit 170 logic to DC offset filter board 70 so that it knows which channel the data that it is going to receive has been generated from.

Reset PROM 166 is used as the reset command source for the analog modules 22 and 24. Scan ram 162 is loaded under computer control. FASTBUS IO port 140 is loaded with a thirty-two bit data word. The output of FASTBUS IO port 140 feeds parallel to serial converter 144 whose output feeds SCAN RAM 162. This output is used to write command information into SCAN RAM 162. An alternative to using reset PROM 166, which has a fixed pattern, is to load SCAN RAM 162 with information from computer 28, using legal bit pattern. RAM address counter 160 feeds SCAN RAM 162 and it also feeds the reset PROM 166. Both reset PROM 166 and SCAN RAM 162 had two hundred fifty-six locations and to access these locations either to write SCAN RAM 162 information from computer 28 or reading from SCAN RAM 162 or reset PROM 166 and building the command word for analog modules 22 and 24. A RAM address counter 160 is used to sequentially address each one of the two hundred fifty-six locations or reset PROM 166 and scan RAM 162. When SCAN RAM 162 is loaded with command information from computer 28 sequencer 150 knows that it is no longer to use reset PROM 166 and then it turns off or tri-states the output of reset PROM 166 and selects the output of serial to parallel converter 164 which is being fed by the output of SCAN RAM 162.

There are two types of data which can be input to DC offset filter board 70. The first type is real data which has been generated by analog commands sent to analog modules 22 and 24. This real data is converted data from the output of analog modules 22 and 24, sent to filter board 70. The second type of data, which can be injected into offset filter board 70, is test data sent by computer command. This is to be used for hardware diagnostic purposes on offset filter board 70. This test data is generated by test data circuit 146.

The entire recording cycle of real data triggers upon the occurrence of the time break signal which is an indication of energy release by energy source 46 or 48. The time break signal is input to analog control board 66 from source synchronizer board 62 and goes through synchronization and buffering logic and time break detection circuit 152 and feeds status multiplexer 154 which provides the status information to sequencer 150 which may or may not select, depending upon the microde routine that is executing at the time, the time break status line. When sequencer 150 has been conditioned to look for the time break signal, it will wait for it to occur and upon its occurrence, it will resynchronize the scanning process. When time break occurs, it is desired that analog control board 66 return to location one of SCAN RAM 162 or location one of reset PROM 166. The reason for doing this is that the programmers know what analog command is in location one of either SCAN RAM 162 or reset PROM 166. When time break occurs, the system will resync and RAM address counter 160 will be reset back to one such that upon the occurrence of time break, the first command generated will be from the contents of location one from either SCAN RAM 162 or reset PROM 166. Location one is typically a command which tells analog modules 22 and 24 to send back status information which programmers use as a marker because they know that it is a fixed pattern and it will occur every time SCAN RAM 162 accesses location one. They use it as a way of monitoring synchronization of the data input cycle.

Figure 6:
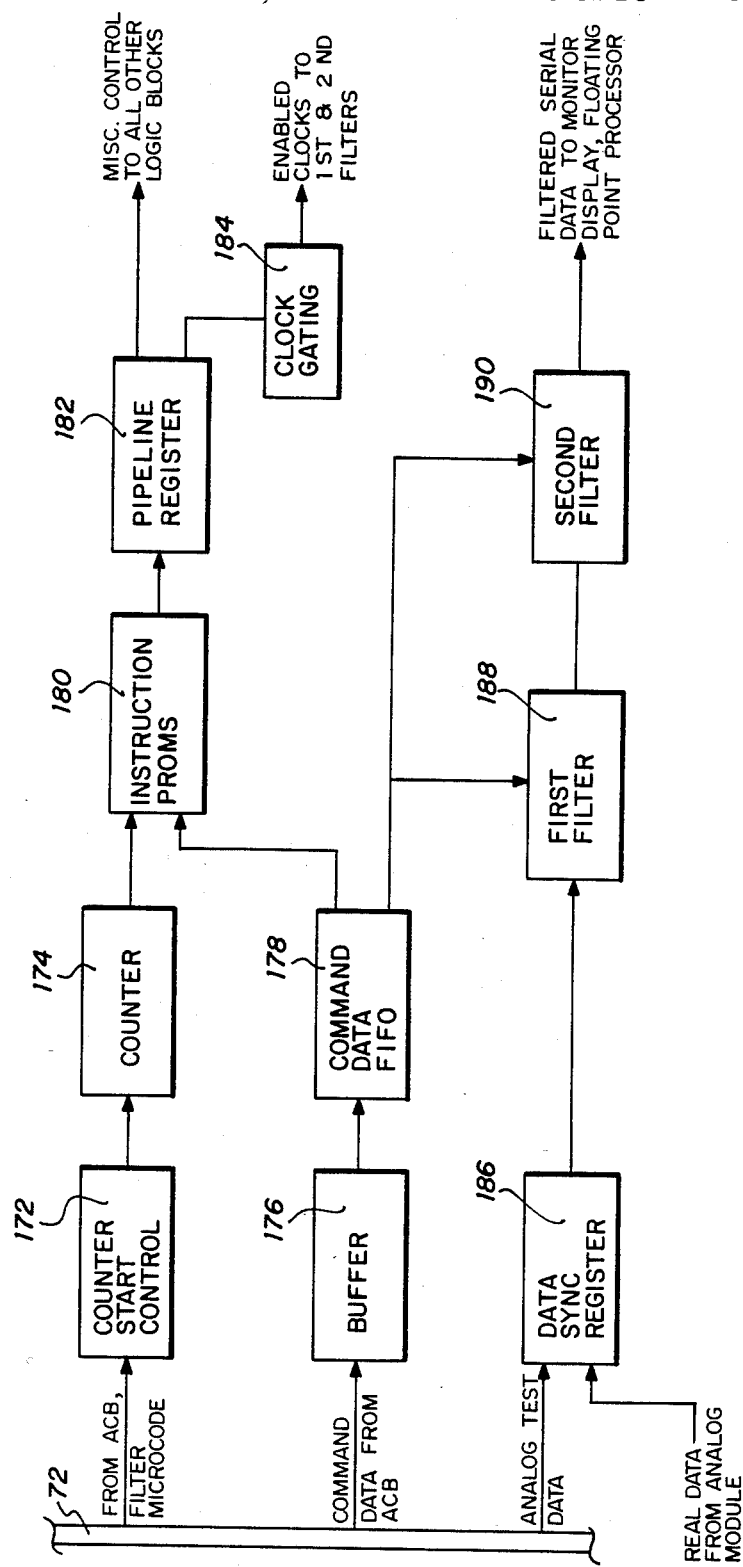
FIG. 6 is a block diagram of the offset filter board of FIG. 2.

Referring now to FIG. 6, DC offset filter board 70 is illustrated in block form. A counter control circuit 172 receives an input through control bus 72 from analog control board 66 and initiates counter circuit 174. Buffer circuit 176 receives an input through control bus 72 and provides the input for command data circuit 178. Command data circuit 178 provides inputs for instruction PROM 180 which feeds pipeline register 182. Clock gating circuit 184 receives inputs from pipeline register 182.

A data sync. register 186 receives serial data from analog modules 22 and 24 and provides the input for a first filter 188 and a second filter 190, each of which receive command information from command data circuit 178. The output of second filter 190 is fed to floating point processor board 58 and monitor display control board 60.

The function of the DC offset removal filter board 70 is to accept the serial data stream from analog modules 22 and 24 and remove any DC bias and offset that exists in the data samples. The filtering process is under the control of command lines from analog control board 66. Counter start control circuit 172 generates an authorization signal which activates DC offset filter board 70 which begins its filtering process. The output of the counter start control circuit 172 feeds instruction counter circuit 174. When DC offset filter board 70 is inactive, the reset is held low and counter circuit 174 remains at location zero and no data processing is down. When analog control board 66 activates DC offset filter board 70, it asserts the start signal which allows counter circuit 174 to run providing addresses for instruction PROM 180. Instruction PROM 180 provides a bit pattern to pipeline register 182 which is used to latch control lines for all logic on DC offset filter board 70. Analog control board 66 also sends over, in addition to the start control lines, address information for the 1st and 2nd filter memories.

The DC offset filter board 70 is a running average type filter which means that the filtering process involves the updating of a memory value. There exists one memory value for every active channel in analog modules 22 and 24. A data sample has a corresponding channel address, which is used to reference a running average value that is stored in memory. The command address information consists of analog module address information and also the rate at which the channel is being sampled. This information from analog control board 66 is input through buffer circuit 176 to command data circuit 178. Along with the address information and the sample rate information, there is another field of 3 bits which are called the program bits. Depending upon the type of software command issued to analog control board 66 and the data that then is written into SCAN RAM 162, different types of data processing programs can be executed upon the data which is brought back from analog modules 22 and 24. The three bits of the command field provide the most significant three bits of the address to instruction PROM 180. This determines the type of program or the type of processing that will be applied to the serial data which is received from analog modules 22 and 24.

On this filter implementation, there are 2 kinds of data processing done on the serial data coming from analog modules 22 and 24. The first type is designated as the normal filter operation. In that mode of operation, the DC offset is removed from the sample and it is output to floating point processor board 58 and monitor display board 60. The second type of filtering operation is the bypass mode in which data from analog modules 22 and 24 is passed through first filter 188 and second filter 190, without any bias or offset removal done. The reason for this mode of operation is primarily for hardware alignment of analog modules 22 and 24. There is a set of adjustments by which DC offset added by the analog logic in analog modules 22 and 24 is removed. In order to do these adjustments properly a data sample that has its full DC offset must be analyzed. DC offset filter board 70 is set in the bypass mode and then the software will do a computation of the DC offset. This DC offset is minimized by making adjustments on analog modules 22 and 24. The data which is generated by sending commands from analog control board 66 to analog modules 22 and 24 is returned to DC offset filter board 70 and is fed into data sync. register 186. Data sync. register 186 prevents the serial data stream from getting out of synchronization with the command data words coming from analog control board 66. The primary cause of the synchronization problems is occasional noise on the clock lines being returned from analog modules 22 and 24. The output of data sync. register 186 feeds first filter 188. First filter 188 is also fed by the output of command data circuit 178.

Analog modules 22 and 24 have a pipeline architecture. That means that the process converting an analog sample to a digital serial word is broken down into a set of subprocesses. The pipelining architecture enables analog modules 22 and 24 to be applying one subprocess to the first sample and at the same time applying a second subprocess to a second sample. It breaks the entire conversion process into little pieces and allows the system to operate simultaneously on samples of different channels at different points in the pipeline process. This in general allows analog modules 22 and 24 to achieve a faster throughput rate than would be possible without the pipelining architecture. The result of this pipelining is that when an analog command is issued to analog modules 22 and 24, there is a period of time until the data word that is generated by that command is sent back to DC offset filter board 70. The purpose of command data circuit 178 is to deskew or align in time the analog commands with the data generated so that data matches its originating command. The command information is used to look up a value in memory which is used in a running average process to remove the offset of the data sample. The memory value at the end of the filtering process is then updated to a new value.

The offset removal is broken into two stages, one comprising first filter 188 and the second stage comprising the second filter 190. The reason for breaking into two pieces is that there are two types of offset or bias in the data that comes back from analog modules 22 and 24. The first type of offset is generated in the internal floating point amplifier of analog modules 22 and 24 and is referred to as direct current. The second type of offset is generated by the preamplifiers, the analog to digital converter and analog signal conditioning circuitry.

The first filter 188 removes bias which is generated by the internal floating point amplifier. The internal floating point amplifier converts or operates in a floating point mode and does what is called gain ranging. It will look at the value of the input sample that it is trying to amplify and it will confine the amplitude of that sample to within certain limits, to within greater than nineteen percent and less than eighty-four percent of the full scale output of the amplifier. It will increase or decrease its gain to get the data sample within this window and at the same time as it is changing its gain, it will be setting an exponent to go along with the mantissa. So the output of the floating point amplifier within an analog module will be a mantissa which is still an analog signal and it will also be a three bit code indicating the amount of gain the amplifier had to apply to the sample to get it within the nineteen percent to eighty-four percent window. The amplifier can range through eight discrete steps. Each one of these amplifier gain settings has a DC offset associated with it so the function of first filter 188 is to examine the gain bits of the serial data word coming from analog modules 22 and 24 determine a value in its memory which will be the offset associated with that gain setting. It will then take that memory value and subtract it from the data sample thus removing the DC offset associated with the gain setting and the amplifier.

Periodically this value needs to be updated to reflect any drift in the amplifier. Analog control board 66 contains a special command which will cause analog modules 22 and 24 to short the input of its amplifier to ground and assume a gain setting and convert that value to a digital output. That value is the digital equivalent of the DC offset of the amplifier at the set gain. This command which happens once every scan will generate an offset for a particular gain value. DC offset filter board 70, by looking at the command bits it has received from analog control board 66 knows that this is a special type of command. DC offset filter board 70 will jump to the proper routine so that it will take this gain value and use it to update the memory value of first filter 188. This is done so the memory, which is associated with the 8 gain settings in the amplifier will be updated in the event that the offset is changing either in the short term or the long term.

The output of first filter 188 is fed to second filter 190 which removes offset associated with the individual channels, signal shaping and also the analog to digital converter. Second filter 190 is slightly different from first filter 188 in that it does not measure, per se, DC offset and store it. It is the digital equivalent of a high pass filter and it always updates its memory values on a channel by channel basis whereas first filter 188 will only update its memory value when it receives special offset information back from analog modules 22 and 24. The output of second filter 190 fans out to two destinations. The first destination is floating point processor board 58 and the second destination is monitor display board 60.

Figure 7:
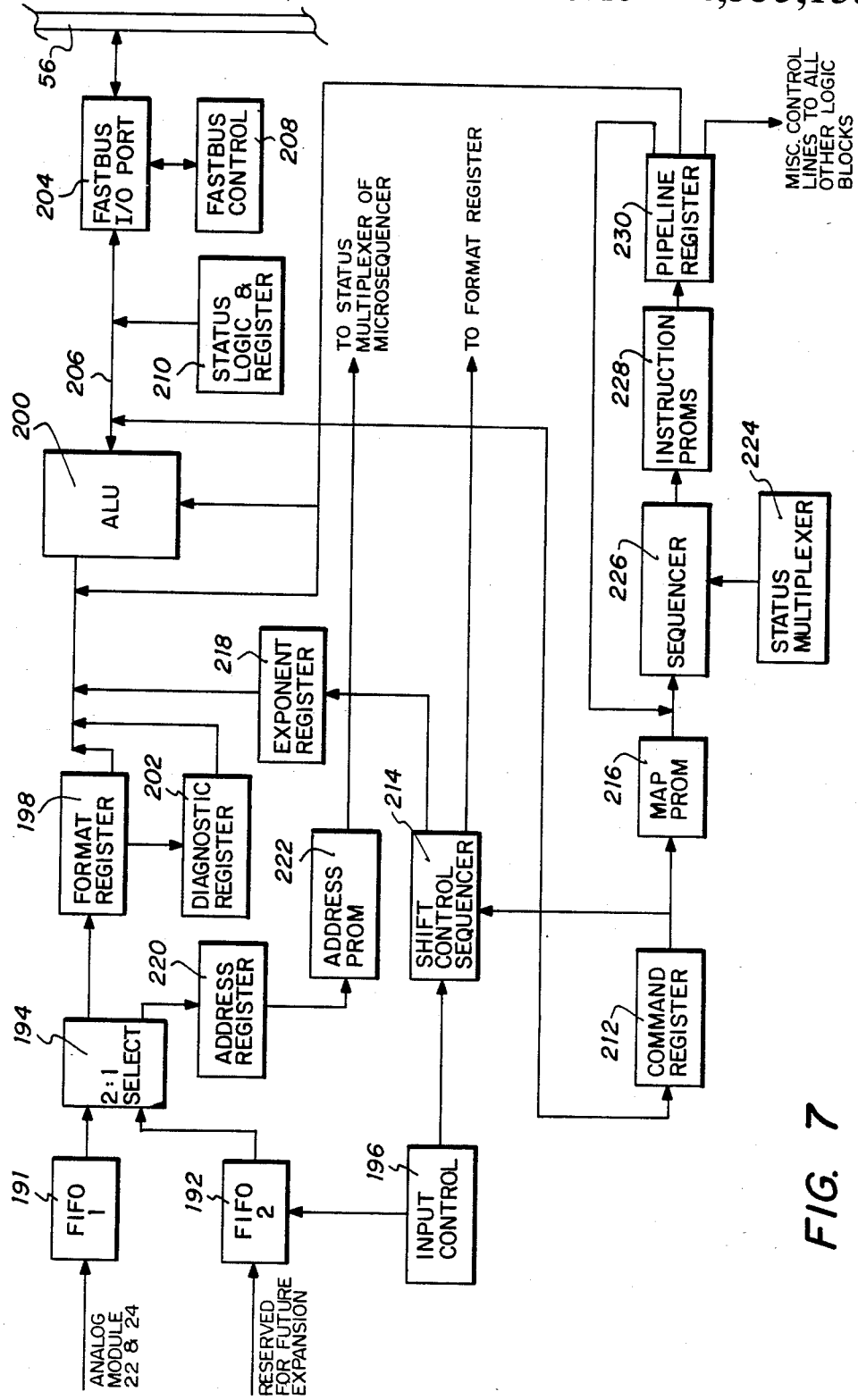
FIG. 7 is a block diagram of the floating point processer board of FIG. 2.

Referring now to FIG. 7, floating point processor board 58 is illustrated in block form as receiving an input from analog modules 22 and 24 through DC offset filter board 70 at FIFO circuit 191. The preferred embodiment of the present invention uses two analog modules for a greater number of input channels although only one analog module may be used for smaller data acquisition systems. Certain portions of the following circuitry may be eliminated by one skilled in the art if only one analog module is to be used.

Outputs from either FIFO circuits 191 and 192 may be fed to select circuit 194, under the direction of input control circuit 196. Select circuit 194 provides an input to format register 198 which provides inputs to arithmetic logic unit 200 (ALU 200) and diagnostic register 202. Diagnostic register 202 also provides an input to ALU 200. ALU 200 provides an output to IO port 204 through intercommunication connection 206. IO port 204 receives inputs and provides outputs to communication FASTBUS 56 and control circuit 208. Intercommunication connection 206 receives an input from status logic 210 and provides an input to command register 212 which provides an input to shift control sequencer 214 and MAP PROM 216. Shift control sequencer 214 receives an input from input control circuit 196 and provides outputs to format register 198 and exponent register 218 which provides an input to ALU 200.

Select circuit 194 provides an input to address register 220 which provides information for address PROM 222. Address PROM 222 provides an input to status multiplexer 224 which along with MAP PROM 216 provides inputs to sequencer circuit 226. Sequencer circuit 226 provides an input to instruction PROM 228 which provides an input to pipeline register 230. Pipeline register 230 provides a feedback input to sequencer circuit 226, and an input to ALU 200.

Floating point processor board 58 accepts serial data from DC offset removal filter board 70, converts that serial data to a software specified floating point format and then transfers the data over FASTBUS 56 to HSD interface 54. The serial data is input to FIFO circuit 191 and or FIFO circuit 192. The input to FIFO circuit 191 is designated as DFS string 1. The input to FIFO 192 is designated as DFS string 2.

In a maximum configuration, there would be two analog control boards 60 and two DC offset filter boards 70 in a land data acquisition system. Each analog control board 66 would be controlling one string of analog modules 22 and 24 up to 4 modules per string. The data generated from the first set of analog modules would go to FIFO circuit 191 through the filter and the data generated from the second string would go through the filter to FIFO circuit 192. FIFO circuits 191 and 192 are memory devices that allow one frame of serial data to be stored before that data is processed by the floating point board. The determination of which of FIFO circuits 191 and 192 to empty is done by input control circuit 196. It has intelligence to determine how many strings are active and it also monitors the amount of data in each of FIFO circuits 191 and 192 to determine which one has to be emptied first to ensure that no data overflow conditions occur. It also will provide the control to two to one selector circuit 194 which reflects which FIFO circuits 191 or 192 has been selected by input control circuit 196. There are two output lines of concern. The first line goes to a format register 198. This is the serial data which has been sent over from DC offset filter board 70. The serial data also has an address associated with it. This address is used to determine whether the data sample that has been received is from an actual data channel or is status information from analog modules 22 and 24. This address information feeds address register 220 which converts it from a serial to a parallel format. The parallel output of address register 220 is an input to address PROM 222 which generates output lines signifying whether it is status or data. Address PROM 222 may also produce a format bit signaling floating point processor board 58 either to pass the sample through its logic without altering it or to apply the specified format to it.

This format bit can be set under software control at analog control board 66 and is one of the bits in the thirty-two bit word which is loaded into SCAN RAM 162. This bit, when it is read out of the SCAN RAM 162 is transferred from analog control board 66 over to DC offset filter board 70 which then passes it along in the filtered serial data word as one of the address bits to floating point processor board 58. Control outputs of address PROM 222 then feed status multiplexer 224 of sequencher circuit 226.

The data is fed in a serial string into format register 198, which has two modes of operation. The first mode is a serial to parallel conversion as the data sample is being shifted in. Then if a floating point has been selected, the format register will then change modes and become a multishift bidirectional shift register. In the second mode of operation, the format register is under the control of shift control sequencer 214 which provides information to format register 198 so that it can shift in the proper direction and also with the correct number of shifts.

Format register 198 can shift bidirectionally (either left or right), zero, one, two or four shifts. It has the ability to rapidly move the data word either to the left or right and under the control of shift control sequencer 214. Shift control sequencer 214 is a set of programmable read only memories. It is told which type of floating point format is to be implemented by command register 212. Command register 212 is loaded with command information from computer 28 which is transferred into FASTBUS IO port 204. FASTBUS IO port 204 is enabled onto intercommunication connection 206 and loaded into command register 212 under control of the microsequencer. The bits in command register 212 comprise the field which tells shift control sequencer 214 the type of floating point format that has to be implemented, either IBM standard floating point format, SEL floating point format, DFS floating point format or CDC floating point format. Shift control sequencer 214 will generate the control lines to format register 198 to shift the appropriate number of bits either left or right.

The appropriate number of bits is determined by the type of format that has been specified and the number of sign bits on each data word. The control lines to shift control sequencer 24 come from several sources. The first is command register 212 which contains the floating point format that has been software selected for converting the data samples. Another input to shift control sequencer 214 is the actual sign of the data samples. All of these inputs are combined in shift control sequencer 214 to generate the number of shifts and the direction in which to shift. This information is applied to format register 198 which then moves the data sample either left or right the appropriate number of places.

When the shifting process is completed input control circuit 196 sets the status flag which is input to status multiplexer 224. Sequencer circuit 226 sees the status flag set and it knows that format register 198 has finished its portion of the data conversion task. Sequencer circuit 226 controls ALU 200. The function of ALU 200 is to apply the finishing touches to the floating point conversion task and to combine the shifted number with its exponent. Due to some peculiarities in the various formats that are being used and also due to space limitations which restricted the architecture that could be used, various special cases arise in the floating point formats which need to be adjusted in ALU 200. This adjustment process consists of examining the value of the output of the format register, determining if that value is a special case and then shifting the data sample either left or right the appropriate number of shifts in ALU 200 to account for the fact that it is a special case.

Also providing an input to ALU 200 is exponent register 218. Depending upon the amount that the sample has to be shifted, it will also have to adjust the exponent. Along with the shifting of format register 198, shift control sequencer 214 also will generate the proper exponent which is dependent upon the selected format and also the number of sign bits. This is loaded into exponent register 218 and is input to ALU 200. Upon the occurrence of special cases, this exponent is adjusted arithmetically in ALU 200 to reflect that occurrence. ALU 200 is a special case detector which will then shift the data sample either left or right and arithmetically adjust exponent register 218. It is also used to do an arithmetic adjustment upon the data sample in the conversion to the CDC floating point which is one's complement floating point format. The data sample that is received from DC offset filter board 70 is two's complement. So, upon the occurrence of a negative data sample from the CDC floating point, ALU 200 is used to convert the negative sample from two's complement to one's complement.

Another arithmetic function applied to the data sample; in the IBM floating point format it is a sign magnitude format, again the input sample is two's complement, so ALU 200 is used to convert that data sample from two's complement negative value to the signed magnitude negative value. ALU 200 does minor adjustment on the data and the exponent. The output of ALU 200 is a final formatted floating point value. During the normal recording cycle, the value is then loaded into the FASTBUS 56 at IO port 204. The ALU functions on the half word basis and handles sixteen bits at a time. This is again due to space restrictions which will not allow for a full thirty-two bit word. The sixteen bit output of ALU 200 is loaded half word at a time into FASTBUS IO port 204 with the destination designated as being HSD interface 54. HSD interface 54 then receives the properly formatted data sample and places it in its data FIFO circuit 86 (see FIG. 3) and then will move it into computer 28 if it is commanded.

Connected to intercommunication connection 206 is status logic 210. When the floating point processer has received a status command, it will place its status information on FASTBUS 56 by loading it to FASTBUS IO port 204 and transferring it to interface 54.

The data sample which is output from DC offset filter board 70 is forty-four bits in length. During the normal data acquisition process, only the upper thirty-two bits are of interest, the lower twelve bits which are added by the filtering process are discarded. The data word that is received from analog modules 22 and 24 is a 16 bit data sample with three bits of gain, when the gain is removed a thirty-two bit sample results. The twelve extra bits, for a total of forty-four, get added by the filtering process and hence are not real data and it is not desired to be input during the recording cycle. Diagnostic register 202 is used to return the twelve least significant bits of a forty-four bit data pattern, and if the processer is commanded to do so, it will transfer these twelve bits to the computer. This is necessary for diagnostic verification of filter board hardware integrity. As an alternative to floating point conversion, the processor can apply up to seven "right-shift sign-fill" operations to the filter word. This process is done by the ALU 200 and is transferred by FASTBUS IO port 204 to HSD interface 54. The number of shifts is specified in the software command word.

Additionally, the floating point conversions also remove a software-related preamplifier gain to generate a processor output whose binary value is equivalent to the analog input level at the analog modules 22 or 24.

The preamplifier is located in the analog module. A preamp gain of zero, twenty-four, thirty-six, or forty-eight dB can be removed.

Figure 8:
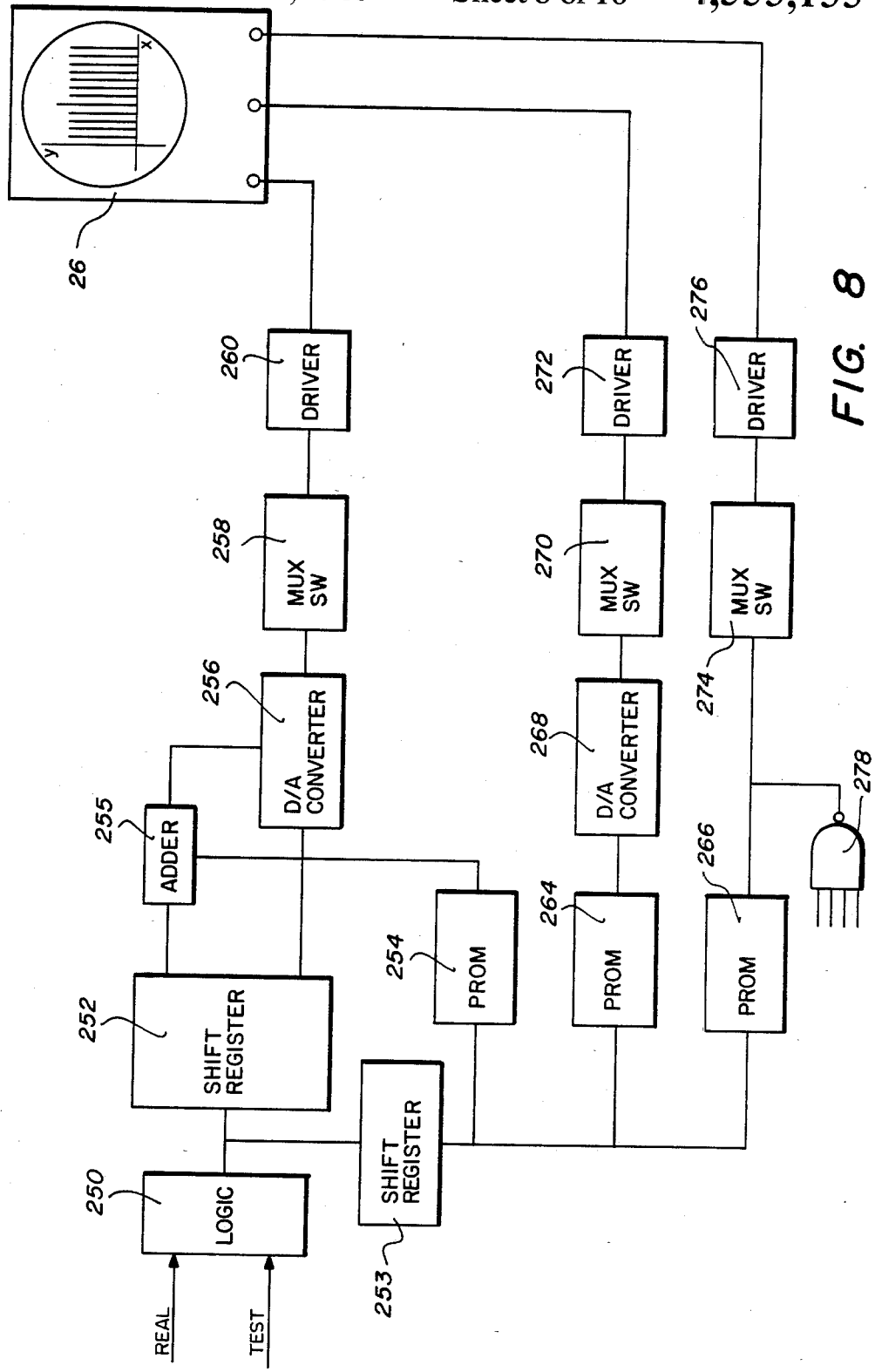
FIG. 8 is a block diagram of the monitor display control board of FIG. 2.

Referring now to FIG. 8, the circuitry for scope 26 is illustrated in block form. Logic circuit 250 may receive two inputs, one real seismic data which is received from a string of acoustic energy detectors through interface unit 18 and the other test data which is also received through interface unit 18 but is generated by computer 28 to test the circuitry of scope 26. The output of logic circuit 250 is bifurcated to shift register 252 and to a second shift register 253. Shift register 252 feeds digital-to-analog converter 256, which feeds through multiplexer switch 258 to driver circuit 260. The output of driver circuit 260 corresponds to the y deflection on scope 26. The output of shift register 253 is bifurcated to feed PROM 264 and PROM 266. PROM 264 feeds through digital-to-analog converter 268, multiplexer switch 270 and driver circuit 272 to provide the x deflection for scope 26. PROM 226 feeds through multiplexer switch 274 and driver circuit 276 to provide intensity control for PROM 266. Multiplexer switch 274 also receives an input from NAND gate 278 which will control the intensity whether specific X coordinate displays are to be intensified or all over driven or noisy channels are to be intensified.

Scope 26 implements three basic types of display formats. The first format is called a "picket-fence format". Information received by logic circuit 250 from the DC offset filter has an address along with the data. The address in the picket fence display is converted to the x deflection on scope 26. The amplitude is converted to the y deflection. The height of each picket in the picket fence display is proportional to the amplitude of the input signal or the data signal.

The second display is a single channel display which can be selected under software control. A single channel can be selected from the serial input data and displayed either with the amplitude as the y deflection or, using the internal time base on scope 26, as a normal oscilloscope display.

The third display is a display as an analog input. An analog input can be selected for both the y and the x axis of the scope and in this mode phase differences between two signals can be displayed via lissaguos patterns on the scope.

In the picket fence display, the operator under software control has the ability to select intensification intervals to aid him in locating traces. For example, every tenth trace may be intensified allowing easy location of channels in a multi-channel system on the display. Output channels which are overdriven also may be selected to be intensified which aids in the location of noisy traces. The gain to be applied to the input data allows increasing or decreasing scope amplitude for an optimum display. Input logic circuit 250 converts the serial data stream from the offset filter into a data format that is suitable for display on scope 26.

Scope 26 has the ability to accept real seismic data from the filter board or inject a test data stream created by computer 28 and fed to scope 26 through interface unit 18 to check out its logic circuits. The selection of whether real data or test data is to be processed is done internally within logic circuit 250. Shift register 252 accepts the serial data, either test or real, and converts it to a parallel word. Similarly, PROM 254 converts the serial address. An offset is added to the parallel word and fed through digital-to-analog converter 256, multiplexer switch 258 and driver circuit 260 to provide the Y-axis deflection for scope 26.

PROM 264 takes the parallel word from PROM 254, which is the channel address information, and feeds this information through digital-to-analog converter 268 multiplexer switch 270 and driver circuit 272 to provide the deflection, or the location on scope 26 which corresponds to the amplitude information fed through the y deflection information for scope 26. Along with the x and y axis information, the z axis can also be controlled by a circuit which corresponds to trace intensity. PROM 266 generates the intensification control signals and through the control of NAND gate 278, the generated intensification control can either intensify either every nth channel or overdriven channels. The combination of the output of NAND gate 278 and PROM 266 are fed through multiplexer switch 274 and driver circuit 276 to provide the intensity control for scope 26.

Figure 9:
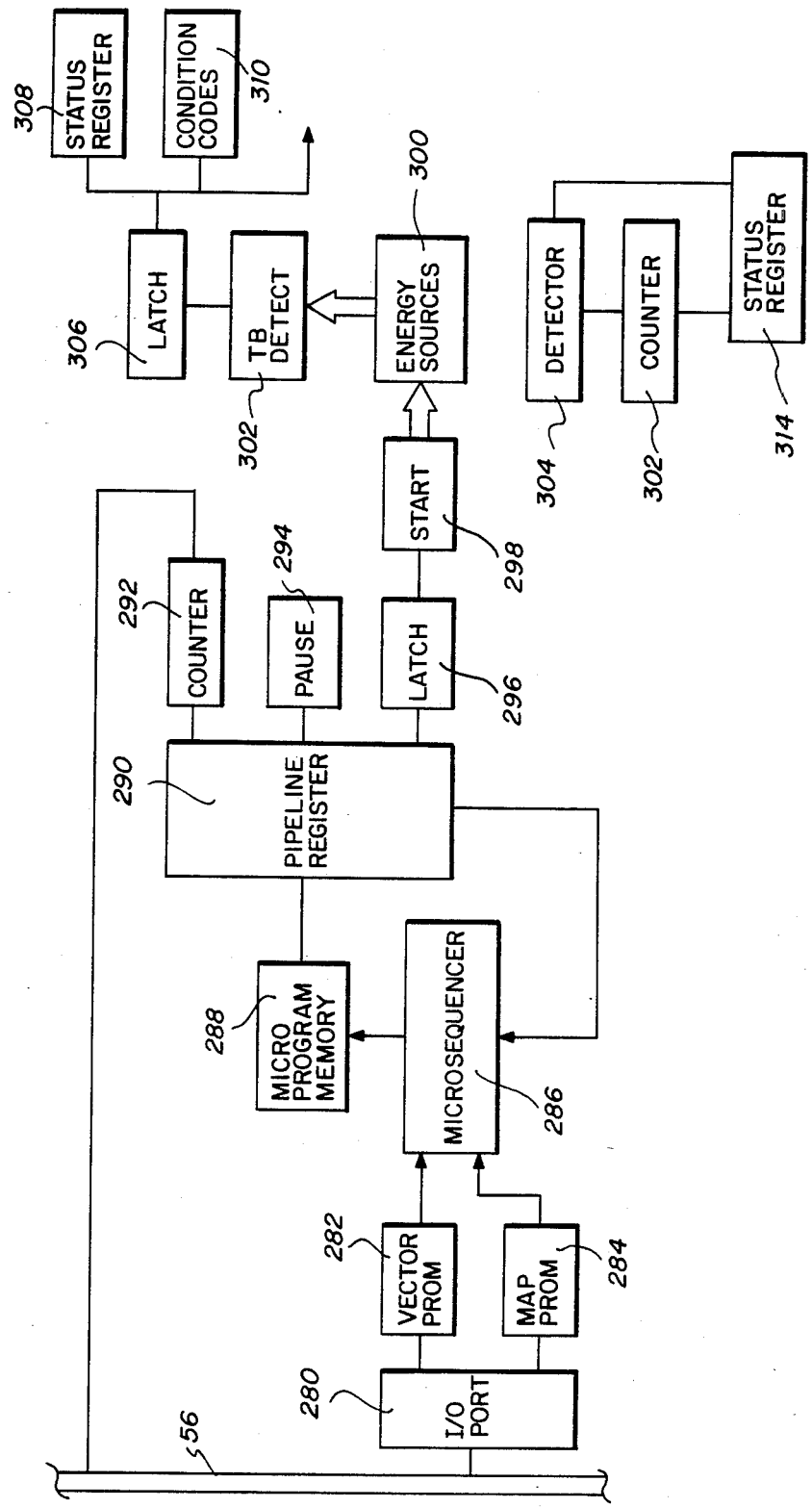
FIG. 9 is a block diagram of the source synchronizer control board of FIG. 2.

Referring now to FIG. 9, a block diagram of energy source synchronizer board 62 including energy sources such as "SS 200" blaster encoder 46 or Pelton encoder 48. IO port 280 receives an input from HSD interface 54 through FASTBUS 56. Vector PROM 282 and map PROM 284 each receive inputs from IO port 280 and provides outputs to microsequencer 286. Microsequencer 286 provides an input to micro program memory 288 which provides a pipeline register 290. Pipeline register 290 provides an input to counter circuit 292, pause circuit 294 and latch circuit 296 along with an input to microsequencer 286. Counter circuit 292 provides an input to FASTBUS 56 and latch circuit 296 provides an input to start circuit 298. Start circuit 298 provides the initiation command for energy sources such as blaster encoder 46 or Pelton encoder 48, however, energy sources 300 may be of any type currently used in the seismic exploration art. Energy sources 300 feed information to time break detector 302 and acoustic energy detector 304. Time break detector 302 provides an input to latch circuit 306 which provides inputs to status register 308 and condition codes circuit 310 along with feeding time break information to analog control board 66. Acoustic energy detector 304 provides an input to counter circuit 312 which provides an input to status register 314. Status register 314 provides an input to acoustic energy detector 304.

Energy source synchronizer board 62 is designed to initiate a start command to energy source 300 and to receive a time break signal back from energy source 300 and to initiate recording in the data acquisition system. Energy source synchronizer board 62 (ESS board) receives commands and data from HSD interface 54 through FASTBUS 56. Source synchronizer board 62 accepts two types of commands, and IOCB word zero command and an IOCB word one command. These commands are received by IO port 280, and are routed to vector PROM 282 and map PROM 284 for decoding and are forwarded to microsequencer 286. Microsequencer 286 generates the next address of micro program memory 288 which has approximately eight different fields. Micro program memory 288 provides an input to pipeline register 290. Pipeline register 290 provides a jump field output which is fed into microsequencer 286. Pipeline register 290 also feeds signals that are broken down into different latches and condition codes that are used for tests and pulse and latch generation.

After all commands have been decoded by victor PROM 282 and map PROM 284, source synchronizer board generates an initial start command through vector PROM 282 to energy source 300. Energy source 300 receive the initiation command and a start initiation signal is generated and forwarded to time break detector 302. Time break detector 302 forwards the signal to latch circuit 306 and the time break signal held in latch circuit 306 is a time break indication to status register 308 of the condition codes circuit 310 and is forwarded to time break detection circuit 152 of analog control board 66 (see FIG. 5).

When energy sources 300 actually generate seismic accoustic pulses, a signal is picked up by acoustic energy detector 304. Acoustic energy detector 304 feeds this information to counter circuit 312 which is used to detect the difference between initiation time break fed through time break detector 302 and the actual time break detected by acoustic energy detector 304. Counter circuit 312 then feeds this information to status register 314. The time break detected by acoustic energy detector 304 is called confirmation time break which is an actual analog signal returned from energy sources 300 confirming the fact that it did generate a seismic acoustic pulse. The time break detected by time break detector 302 is called a clock time break and is a measured time interval from the initiation signal from start circuit 298.

The source synchronizer board receives commands under soft ware control which instruct it to issue fire commands to either viberator electronics or blaster electronics (not shown) if the seismic data acquisition system is being used on land or may be used to initiate the firing of air guns (not shown) if used on a marine vessel.

Figure 10:
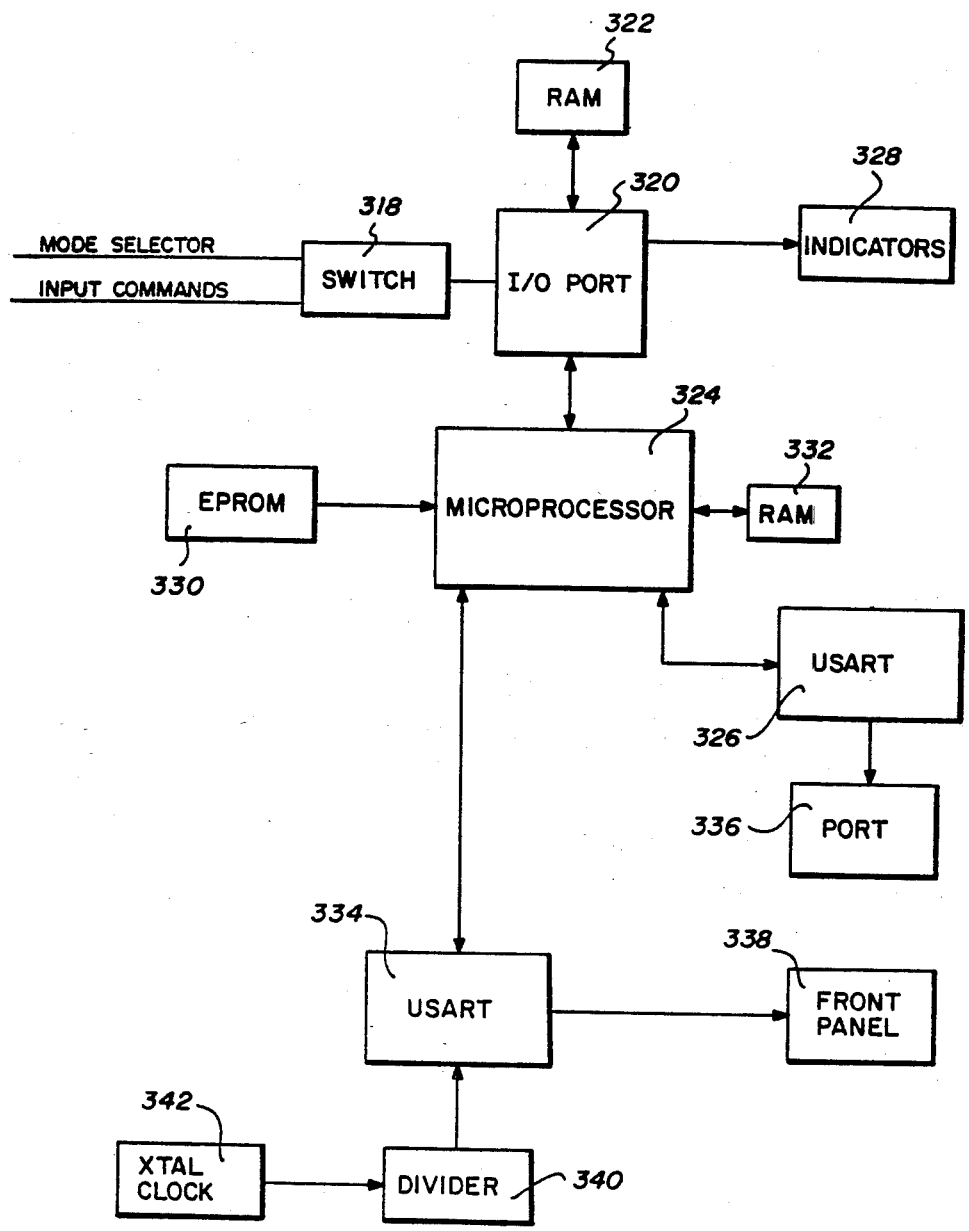
FIG. 10 is a block diagram of the bootload controller of FIG. 1.

Referring now to FIG. 10, bootload controller 38 is illustrated in block form. Selection is to mode, reset, start, step or enable may be made at switch 318. Switch 318 is a block representation, representing switches that are commercially available. In the preferred embodiment, one thumb wheel switch to select mode is preferred while four push button switches are used in function selection. Switch 318 provides an input to IO port 320 which has intercommunication connections to RAM 322 and microprocessor 324. IO port 320 also contains a timer which provides a clock pulse to USART (Universal Synchronous Asynchronous Receiver Transmitter) 326. IO port 320 also provides an input to indicators 328 which may be of any type known in the art, however the preferred embodiment uses six light emitting diode indicators one to indicate ready, one for run, one for pause, and three indicating the various modes. Microprocessor 324 receives an input from EPROM 330 and also has an intercommunication connection between RAM 332 USART 326 and USART 334. USART 326 provides an input to auxiliary port 336. USART 334 provides an input to front panel port 338 and receives an input from divider circuit 340 which receives timing from crystal clock 342.

Bootload controller 38 is an electronic device that is connected to the serial front panel of computer 28. Bootload controller 38 is designed to automate a front panel function such as the entering of a boot strap, the initialization of memory, the ICL (Initial Configuration Load), or various other functions. In the seismic data acquisition system of the present invention bootload controller 38 was designed in support of the entire system since the device from which we will be bootloading (cold start loading) are devices that are not necessarily supported by the standard Initial Program Load of computer 28. Thus a hand loader consisting of anywhere from twenty to several hundred bytes of information recovering anywhere from fifty to five hundred key strokes would need to be entered by hand on the keys of the front panel. Bootload controller 38 automates this process by simulating key strokes and loading the data or program into computer 28 at a very high speed. This loading process consists of reading the simulated keystrokes from EPROM 330 and under the control of microprocessor 324, writing them into computer 28.

The hardware consists of microprocessor 324, which is an 8085, IO port 320, which is an 8155 having RAM 322 with 256 bites of read/write memory and three eight-bit parallel input-output ports and a timer. RAM 322 is an 8185 having one kilobite of read/write memory and EPROM 330 is a 2716 having eight kilobites of read only memory. Serial input/output is accomplished through USART's 326 and 334 which are 8251's. USART 326 is an auxillary which can be used for hardware check out or for certain auxiliary functions.

USART 334 is used to communicate with front panel port 338. In the preferred embodiment front panel port 338 is a serially interfaced control panel manufactured by Gould S.E.L. and has two serial ports. One port connects to the computer 28 CPU board while the other can be used to daisy chain to additional remote panels.

USART 326 emulates another front panel, thus the output of bootload controller 38 will appear the same to computer 28 as another remote front panel port 338.

Other aspects of the hardware of FIG. 10 are the indicators 328 and switch 318 which can be used to functionally select one of several bootstraps, programs or tests. Indicators 328 show what state bootload controller 38 is in. Switch 318 and indicator 328 are interfaced through IO port 320 which, as stated previously contains a counter in order to do internal timing. A 4.3 megahertz crystal clock (not shown) controls microprocessor 324. Divider circuit 340 is a step down divider which controls the clock for USART 334. 4.3 megahertz was chosen because it could divide down and provide different baud rates for auxiliary port 336. The 13.33 megahertz is exactly the same clock used by computer 28 thus it divides down to the same standard baud rate which is the twenty-six kilobaud that front panel port 338 uses. EPROM 330 is used to store the programs which may be loaded into computer 28. EPROM 330 also contains a series of routines which simulate keystrokes from front panel port 338. Thus, a programmer may select any one of a series of routines and feed them into computer 28 without having to key them in by hand at front panel port 338.

Appendix A is the computer program in assembly language of the preferred embodiment which is loaded into bootload controller 38. The program is divided into three portions:

The first portion is called the "executive" portion. This portion of the program contains all the routines and subroutines which are commonly used in normal operation of the unit. This section comprises the "native intelligence" of the unit in that it contains all the routines to determine what function to perform for a particular application based on application dependent data contained in the third section of the firmware. This section should be invariant.

The second portion of the program is called the "debugger" portion. This portion of the program contains routines and subroutines used in checking the hardware and software of the bootload controller itself. The primary use of this section is for maintenance, although a few subroutines are used by the executive during normal operation.

The third portion of the program is called the "tables" portion. This portion contains all the data tables, keystroke routines, and host computer software that is to be downloaded. This section contains all the application dependent codes and data and may therefore be modified as desired for the particular application at hand. The executive section of the program contains interpretation routines which operate off parameters in the "tables" portion of the software. Thus, operation of the bootload controller may be enhanced or customized by changing only the "tables"; therefore the executive remains invariant.

Figure 11:
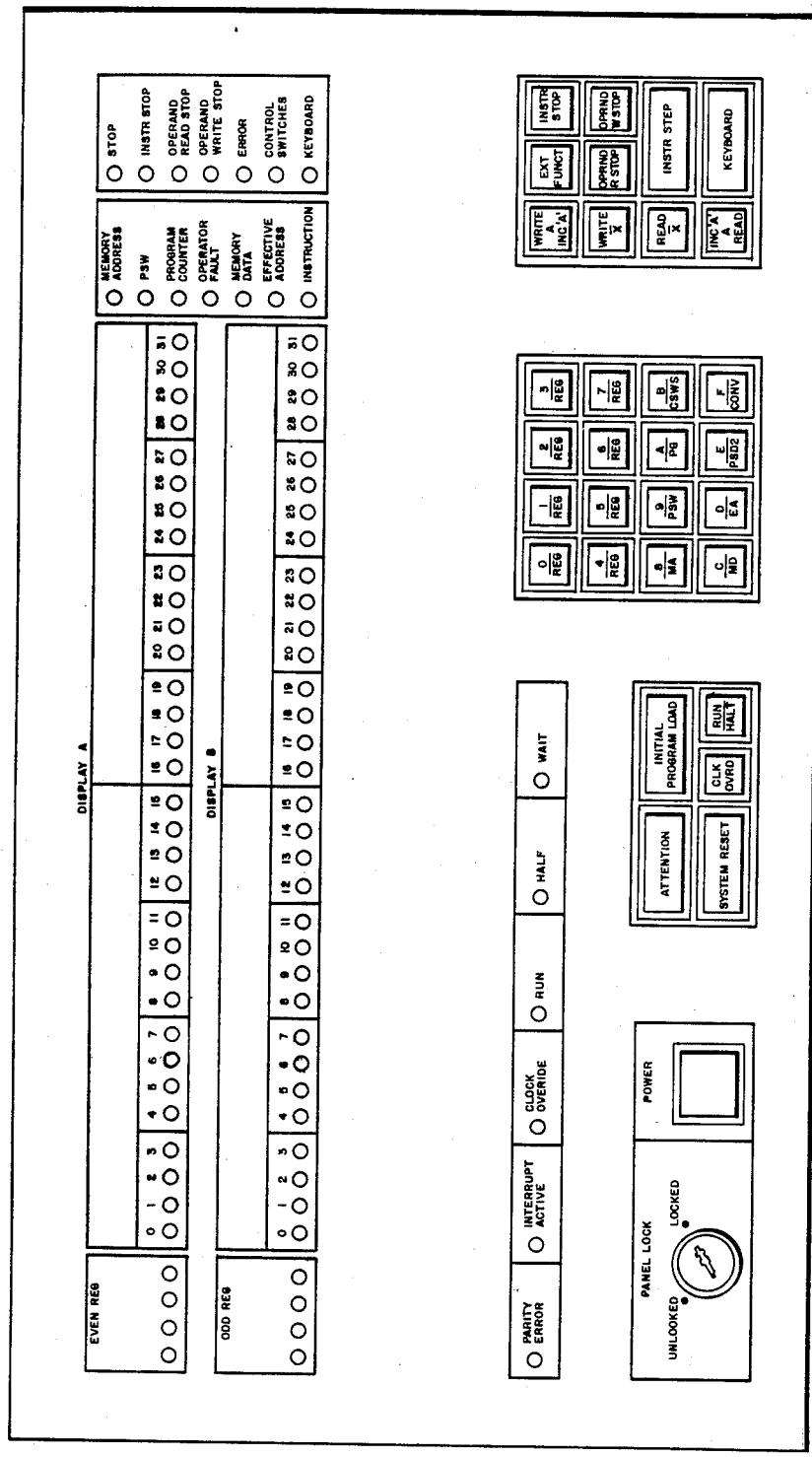
FIG. 11 is a plan view of a computer front panel.

FIG. 11 is an illustration of a front panel 350 of computer 28 of the preferred embodiment. The 32/70 or 32/30 Series computer manufactured by Gould S.E.L. is preferred in the present embodiment, however any computer with similar capabilities may be used by making minor firmware changes in the bootload controller executive.

Figure 12:
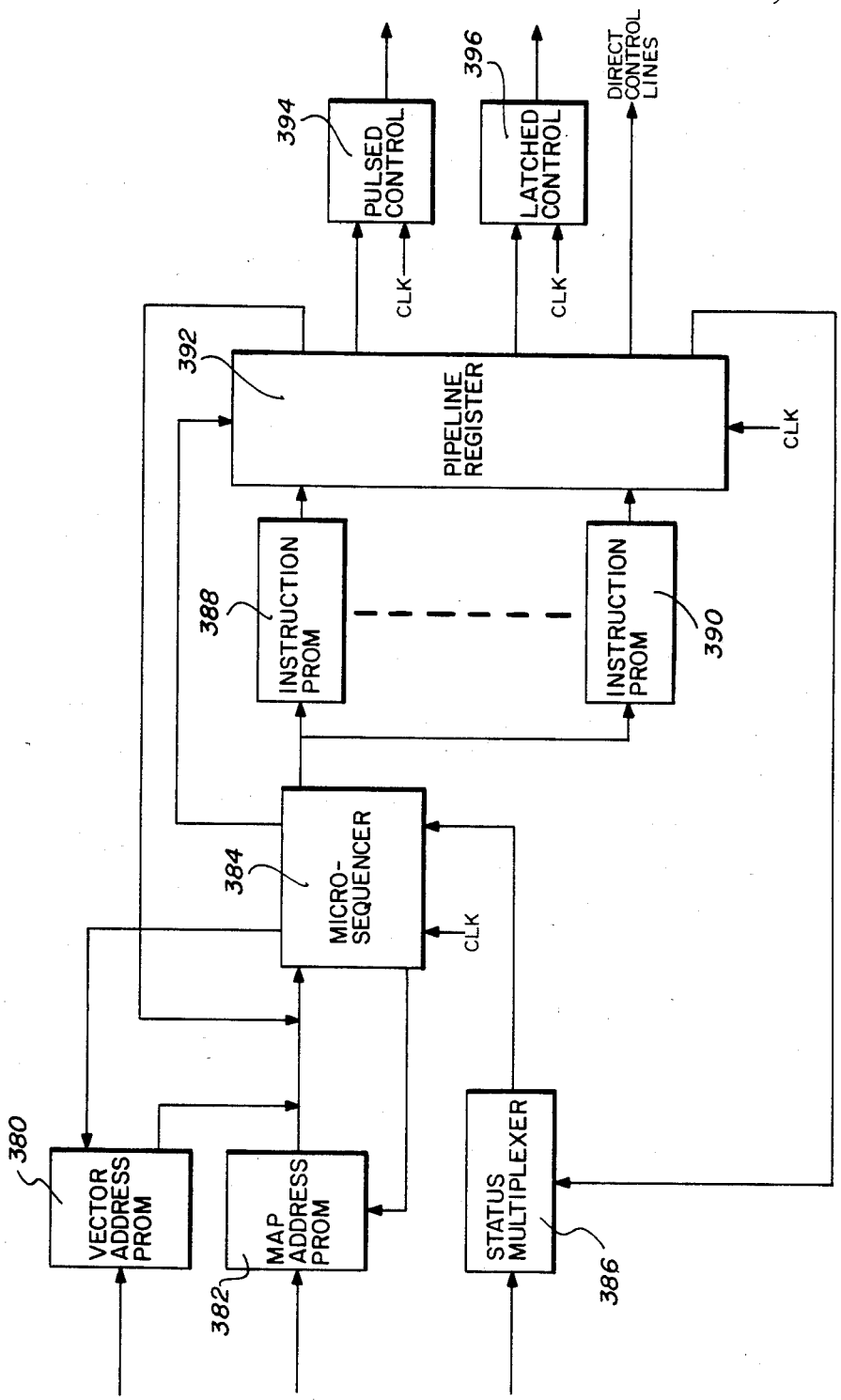
FIG. 12 is a block diagram of a microsequencer communication network used for active devices.

Referring now to FIG. 12, communication circuitry for active control boards used in interface unit 18 is illustrated in block form. Inputs are received by vector address PROM 380 and map address PROM 382 and provide outputs to microsequencer 384. Microsequencer 384 also receives a clock pulse input and an input from status multiplexer 386, and provides inputs to vector address PROM 380, map address PROM 382, instruction PROM 388, instruction PROM 390 and pipeline register 392. Pipeline register 392 provides inputs to pulsed control circuit 394, latched control circuit 396 and status multiplexer 386 along with commands to other direct control lines. Status multiplexer 386 also receives an input of status test information.

FIG. 12 is a block diagram of the typical microsequencer or architecture used in the active devices in interface 18, such as analog control board 66, monitor display 60, etc. All control devices are centered about microsequencer 384 which may be purchsed commercially from Advanced Micro Devices, chip number AM2910 designated as a microsequencer controller. Appendix B contains the programs that are used in the various microsequencer control units throughout the seismic data acquisition system.

When microsequencer 384 is doing nonconditional sequential operations it will use the contents of its internal program counter as the next address for instruction PROM 388 and instruction PROM 390. When the sequencer is doing conditional operations the next address sources could be the jump address which can be either the output of Vector address PROM 380 or map address PROM 382 or the pipeline register 392.

An additional source for the next address is the contents of the internal stack of microsequencer 384. When microsequencer is executing subroutine operations such as returning from subroutine operations, it will use the top of the internal stack as the next address source.

The jump address source for microsequencer 384 can be from one of three sources. First is a vector address PROM 380 which receives typical inputs such as status bits from device dependent logic and its output is a jump address which is used upon the conditional successful status testing by microsequencer 384. The second address source is the map address PROM 382. Typically its input or command bits transfer over FASTBUS 56 from computer 28 and its output is a start address of the proper routine. Typically, this is a start of a specific command routine issuing at that device. The third address source is the output of pipeline register 392. This address source is generated under microprogram control and is the output of instruction PROM 388 or instruction PROM 390.

The instructions that microsequencer 384 can execute are two types, either conditional instructions or nonconditional instructions.

The conditional instructions will be executed contingent upon the state of the output of status multiplexer 386. Status multiplexer 386 inputs are typically pertinent logic signals in the particular device interface. These signals are addressed by control lines from pipeline register 392. One of the status bits will be selected as an output of status multiplexer 386. Microsequencer 384 will execute the conditional operation if the status is of the correct polarity.

For nonconditional instructions, the output of microsequencer 384 is used to address instruction PROM 388 and instruction PROM 390. Instruction PROM 388 and instruction PROM 390 comprise the instruction control word whose width is determined by the specific architecture of the particular device. The output of instruction PROM 388 and instruction PROM 390 is fed to pipeline register 392 and is simply a synchronization register having the width of the instruction word. Its purpose is to make the entire system synchronous.

Several of the fields of pipeline register 392 have previously been described, one the conditional jump field, another the status select lines. There are three types of control fields on the output of pipeline register 392 which are used to influence the device logic. The first type are the direct control lines which go directly from the output of this register to their appropriate places in the logic and are either set high or low depending upon the contents of the instruction PROM 388 and instruction PROM 390. The second type of control lines are latched control lines to latch control circuit 396. An address field in pipeline register 392 along with a polarity bit determines the setting of a specific control latch which is then either set or reset by latch control circuit 396 and will remain in that state until it is again changed by instruction PROM 388 and 390. This type of control line is used for logic conditions where a state does not change frequently in that it can be either be set or reset left for a long period of time and then change depending upon the desires of the program being executed. A third type of control line is the pulse control line to pulsed control circuit 394. Again there is a pulse control address field from pipeline register 392 which will select one of a number of control lines which then are gated with the system clock which generate a logic pulse of the appropriate level for logic control.

Figure 13:
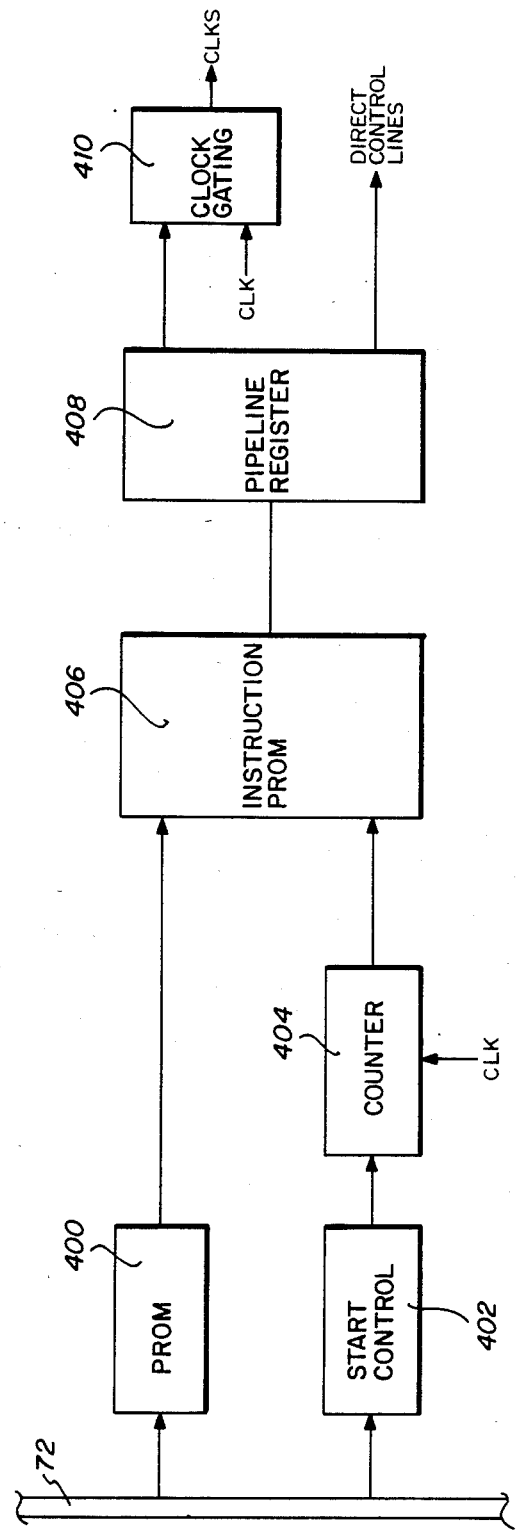
FIG. 13 is a block diagram of a microsequencer communication network for passive devices.

Referring now to FIG. 13, a diagram of the control circuitry for passive devices, such as DC offset filter board 70, within interface unit 18. Command information from a control device such as analog control board 66 are conveyed to PROM 400 and start control circuit 402 over control bus 72. Start control circuit 402 provides an input to counter circuit 404 which together with PROM 400, provide inputs to instruction PROM 406. Pipeline register 408 receives an input from instruction PROM 406 and provides an output to clock gating circuit 410 along with signals to direct control lines throughout DC offset filter board 70.

Figure 14:
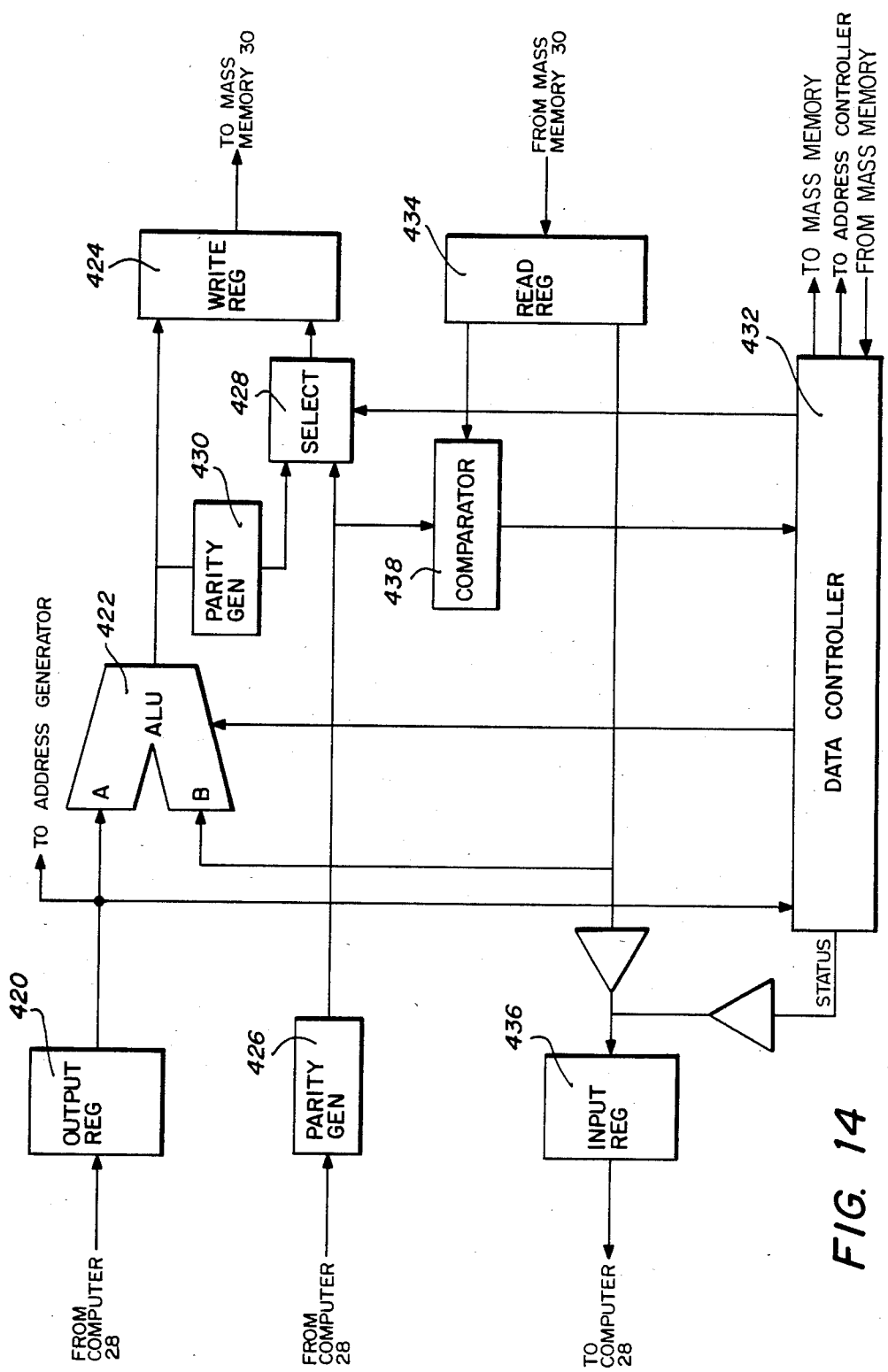
FIG. 14 is a block diagram of an interface controller unit between the computer and the mass memory of FIG. 1.
Figure 15:
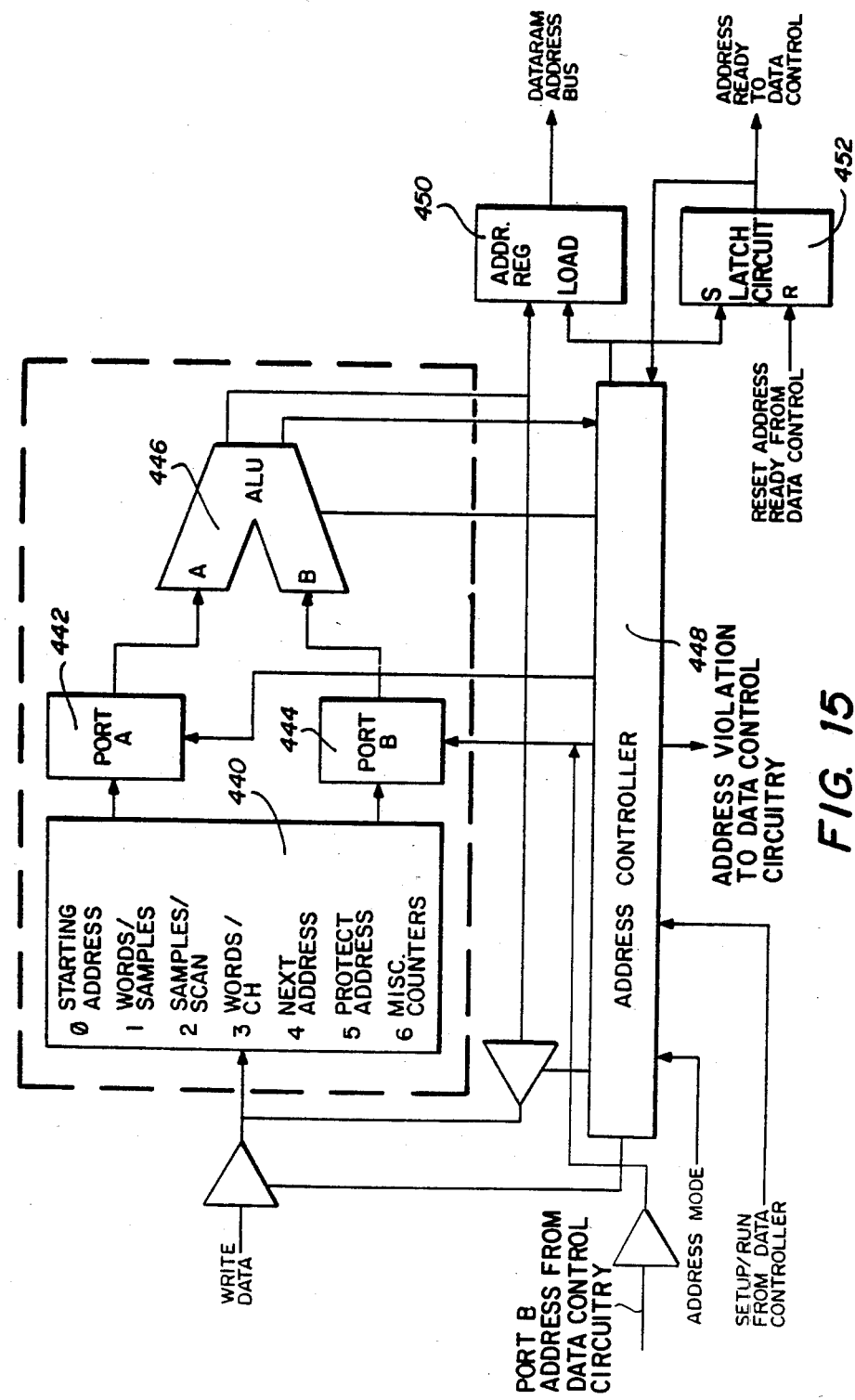
FIG. 15 is a block diagram of the control circuit of the data controller unit of FIG. 14.

FIGS. 14 and 15 illustrate interface 18 with its control circuitry between computer 28 and mass memory 30.

Referring now to FIG. 14, a controller unit used to control the data flow between computer 28 and dataram 30 is illustrated in block form. Data is received from computer 28 through output register 420 which feeds input port A of ALU 422. The output of ALU 422 is fed to write register 424 which writes the data into mass memory 30. Controller 18 also receives a signal from computer 28 to a parity generator 426. The output of parity generator 426 is fed to select circuit 428 which provides an output for write register 424. Select circuit 428 also receives an input from parity generator 430 and data control sequencer 432.

When computer 28 is reading data from mass memory 30 an input is fed through read register 434 and fed to input register 436. Comparator circuit 438 receives an input from read register 434 and from parity generator 426 and provides an output to data control sequencer 432. Output register 420 provides an input to address generator and data control sequencer provides an output to address controller, both of which will be discussed in connection with FIG. 15.

The following is a description of the operation of the mass memory 30 controller of the present invention that controls and handles data transfers to and from mass memory 30. Data control sequencer 432 provides the signals to control the data flow through the other devices illustrated.

The general data path for write data is through output register 420 which latches data as it is brought out of computer 28 through ALU 422 to write register 424 which holds data until mass memory 30 accepts it.

The general data path for a read data operation bringing data out of mass memory 30 is through read register 434 and input register 436 which holds it until computer 28 receives it.

ALU 422 permits stacking data on mass memory 30 through an adding operation. The data controller can read the current contents out of a specific memory location, store it in read register 434 and input it to the B input of ALU 422. ALU 422 takes the current data that is being written and can perform a predetermined function on the data before writing it back to mass memory 30, thus it performs a read-modify-write operation to mass memory 30. Any one of eight functions may be selected from data control sequencer 432. One function is an add, which can be used to stack data.

Parity is generated as data is received from computer 28 by parity generator 426 and is written out along with the data. A thirty-six bit data word is written to mass memory consisting of thirty-two data bits and four parity bits. Parity generator 430 is used when data is being stacked. When data is stacked, parity generated by parity generator 426 is meaningless because the data is modified by ALU 422. Parity must be regenerated after data has been stacked to modify the parity bits that are stored with that word. When data is read from mass memory 30, at the time it is transferred to computer 28, parity is generated by parity generator 426 and it is compared with the parity bits that were read out. Whether or not there is a parity error can be detected by comparator circuit 438.

At the beginning of each data transfer operation to or from the dataram an address must be provided by the interface. The address control circuitry illustrated in FIG. 15 generates these addresses.

Address control sequencer 448 controls a 16 location dual port random access memory (ram) 440. The ports are illustrated as port A 442 and port B 444. The two ram ports provide data inputs to ALU 446, also controlled by control sequencer 448. The ALU output is connected to address register 450 and ram 440 port B input. Ram 440 port B may also be controlled by the data control circuitry in order to initialize the ram 440 prior to data transfer operations.

When the address controller has generated a mass memory 30 address, it is written into address register 450 and an address ready flag is set via address ready circuit 452. This signal indicates to the data control circuitry that the address register contains a valid address and a data transfer operation may proceed. After the address is transferred to mass memory 30, the data control circuitry resets the address ready flag which in turn starts an address controller cycle in which a new address is generated and so on.

Ram 440 is a sixteen location memory, however, the preferred embodiment only used eight locations as illustrated on FIG. 15.

Locations 0 through 4 are initialized by computer 28 through the data control circuitry. The starting address (location zero) is used as an initial location for all data transfers. Locations 1, 2, and 3 contain multiplex mode address control parameters. Location 4 holds a memory protect upper limit address. Locations 8, 9, and 10 are used by the address controller during calculations.

If the memory protect feature is enabled, the computer 28 writes a dataram address into ram 440 location 4. If any subsequent data transfer operation accesses a dataram address above the protect address in location 4 of ram 440, the address control sequencer generates an address violation signal to the data control circuitry. If the data transfer operation causing the address violation is a write to dataram 30, the data control circuitry will abort the transfer operation.

The address controller may be operated in one of two modes, referred to as sequential and multiplexed.

SEQUENTIAL MODE

In the sequential mode, the dataram address is incremented by one after each word is transferred.

MULTIPLEXED MODE

If multiplexed addressing mode is specified, the following memory address sequence is generated:

S, S+1, S+2 . . . , S+A−1, S+C, S+C+1, S+C+2 . . . , S+C+A−1, S+2C, S+2C+1, S+2C+2 . . . , S+2C+A−1 . . . , S+BC, S+BC+1, S+BC+2 . . . , S+BC+A−1, which completes a first scan.

A second and other additional scans may also be similarly generated starting with the address S+A. In most situations A will equal 1 and the sequence will be:
S, S+C, S+2C . . . , S+BC, then S+1, S+C+1 . . . , S+BC+1.
WHERE
S=starting address
A=the number of words/sample
B=the number of samples/scan
C=the number of words/trace This sequence will demultiplex data during a write transfer and multiplex data during a read transfer if multiplexed data is defined as samples in the following sequence:
Samp 1, Channel 1, Samp 1, Channel 2 . . . , Samp 1, Channel B, Samp 2, Channel 1, Samp 2, Channel 2 . . . , Samp 2, Channel B . . . , Samp N, Channel 1, Samp N, Channel 2 . . . , Samp N, Channel B.

And demultiplexed data is defined as samples in the following sequence:
Samp 1, Channel 1, Samp 2, Channel 1 . . . , Samp N, Channel 1, Samp 1, Channel 2, Samp 2, Channel 2 . . . , Samp N, Channel 2 . . . , Samp 1, Channel B, Samp 2, Channel B . . . , Samp N, Channel B.

Address control sequencer 4 and 8 is implemented with an AM2910 microsequencer and associated firmware. The dual port ram 440 and ALU 446 are contained on six AM2901B 4-bit slice ALU's.

Figure 16:
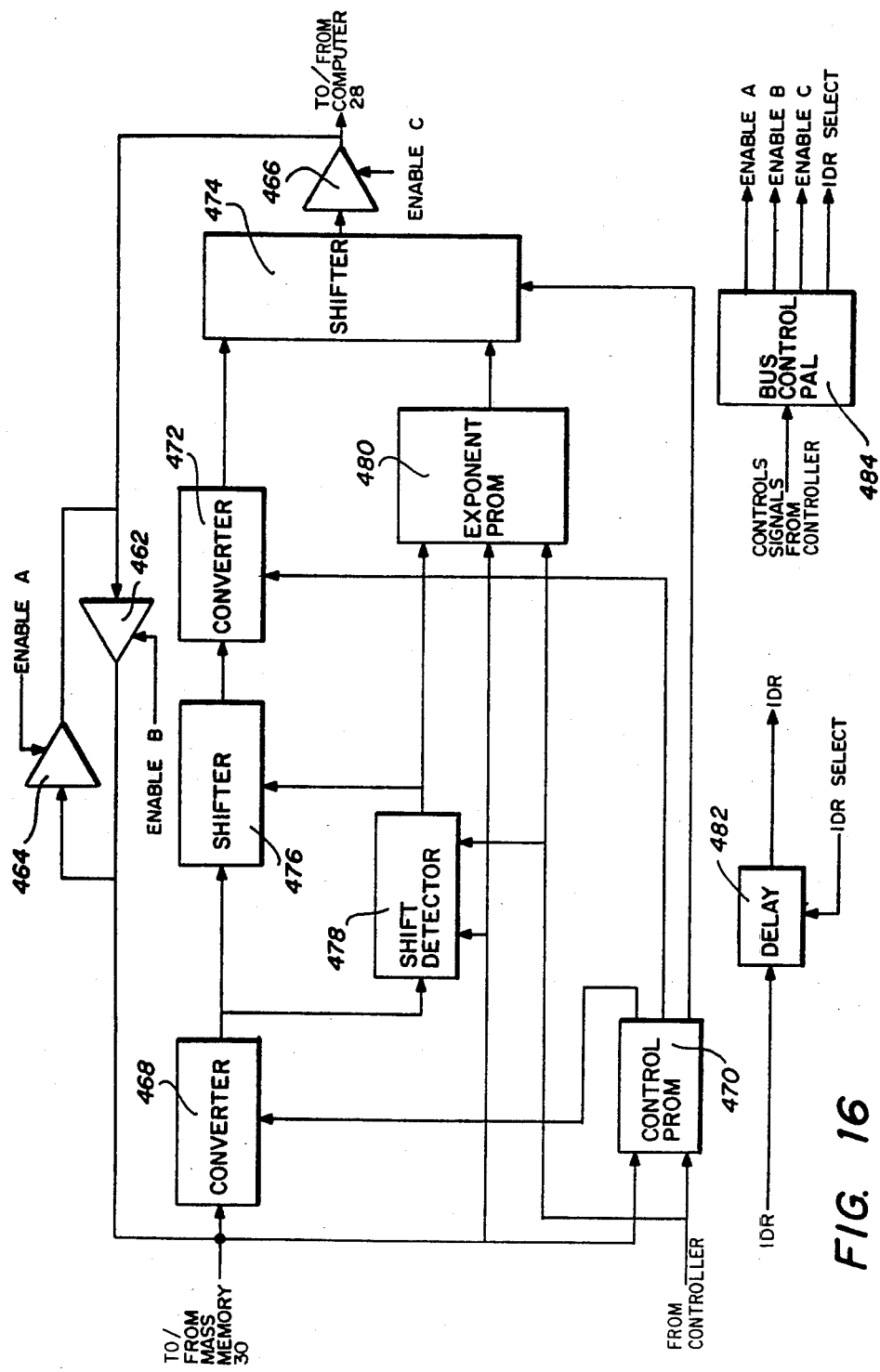
FIG. 16 is a block diagram of a high speed floating point processer.

Referring now to FIG. 16, a floating point converter 460 is illustrated in block form. Floating point converter 460 may be used to convert fixed point data to floating point data when the data is being read from mass memory 30 by computer 28. Data from computer 28 is stored in mass memory 30 in fixed point format if the floating point converter is to be used.

When data is being written into mass memory 30, gate 462 is enabled so that floating point converter 460 may be bypassed. When data is being read from mass memory 30 and floating point converter 460 is not to be used, gate 464 is enabled. When data is being read from mass memory 30 and floating point converter 460 is being used to convert the fixed point data to floating point format, gate 466 is enabled while gates 464 and 462 are disabled.

Data from mass memory 30 is input into two's complement converter 468 and control PROM 470. Format and gain selection signals are also input into control PROM 470 which provides input into two's complement converters 468, 472 and bit shifter 474. The output of two's complement converter 468 is fed to three stage bit shifter 476 and shift detector 478 which provides input to three stage bit shifter 476 and exponent PROM 480. Shift detector 478 and exponent PROM 480 both receive format and gain selection information from mass memory 30. Exponent PROM 480 provides an input to bit shifter 474.

Data transfers from mass memory 30 to computer 28 are delayed approximately five hundred nanoseconds when floating point converter 460 is in use. As a result, the input data ready signal from mass memory 30 must be fed through a delay circuit 482 so that the input data ready signal from mass memory 30 is received by computer 28 at the same time as data from floating point converter 460. Gates 462, 464, 466, and delay circuit 482 are controlled by bus control programmable array logic 484 which receives control signals from mass memory 30.

Floating point converter 460 may be inserted into the data path between computer 28 and interface 18. Floating point converter 460 is used to permit the conversion of the data to a floating point format. Floating point converter 460 is used to convert data from mass memory 30 to a floating point format for writing out on a permanent record. Most of the formats normally recorded involve some type of floating point value. The data comes in from analog modules 22 and 24 as thirty-two bit integer values and is written in mass memory 30 and stacked in that format. Floating point converter 460 performs the same conversions as floating point processor board 58, except that processor board 58 is operating on serial data and floating point converter 460 is operating on parallel as it comes out of mass memory 30.

Floating point converter 460 may be used because computer 28 cannot convert the data to floating point format as quickly doing it in software. Converter 468 receives thirty-two bit parallel data from computer 28 and may perform a two's compliment conversion, depending on the sign of the data word. In this manner, the data output of converter 468 is always in sign-magnitude form. The data goes into shift detector 478 which determines how many shifts to be applied to that data word in order to normalize it. This provides a shift count to three stage bit shifter 476 which normalizes the data, and feeds it to two's complement converter 472. Some formats will have a mantissa in sign-magnitude form, and some will have it in two's complement. Two's complement converter 472 allows the option for either form. The output of two's complement converter 472 is the normalized mantissa of that floating point word. The shift count that was applied goes into exponent PROM 480 along with some other information, for example, the sign of the data, the format selected, and gain removal information. Exponent PROM 480 provides the corresponding exponent to go along with mantissa. They are input to a bit shifter 474 which will left shift either zero, four, eight, or twelve bits to align the word, dependent on the format used. The output of bit shifter 474 is a thirty-two bit floating point value.

The foregoing is activated when reading from mass memory 30 and floating point conversion is selected.

Floating point converter 460 may be bypassed by enabling gate 464 and disabling gate 466. Data can be read through gate 464 without doing any conversion on it. Gate 462 allows data to be written into mass memory unmolested. Floating point converter 460 can only convert the data during a read operation from mass memory 30, write data to mass memory 30 cannot be altered.

In addition to converting to floating point formats, floating point converter 460 can also perform pre-amp gain removal. This process divides the floating point value by some integral power of 2 in order to compensate for gain applied to the analog signals in analog modules 22 and 24. The floating point board can remove gains of 0, 24 db, 36 db or 48 db as selected by the dataram interface 18. This is accomplished by adjusting the shift count applied to shifter 476 and adjusting the exponent read out of prom 480 in such a way as to remove the selected gain value and still maintain a normalized floating point data word.

What we claim is:

1. In a system where seismic data is detected, then preamplified, a floating point formatter comprising:
   first means for receiving fixed point serial data from the preamplifier;
   scaling means connected to said first means for removing bias added by said preamplifier;
   second means for shifting said serial digital data a predetermined number of bits;
   third means for determining an exponent representing the number of bits said serial digital data has been shifted by said second means;
   combining means for combining said shifted serial digital data and said exponent to produce a floating point number; and
   prestacking means connected to said combining means for dividing said floating point number by powers of the number two.

2. The floating point formatter according to claim 1 including control means connected to said first means, said second means, said third means, and said combining means for controlling said shifting of said serial digital data and said determining of an exponent.

3. The floating point formatter according to claim 2 wherein said control means includes means for modifying said second means and said third means for changing said predetermined number and said exponent.

4. The floating point formatter according to claim 2 wherein said control means includes:
   means for receiving a status request;
   means for determining said status; and
   means for transmitting said status information.

5. The floating point formatter according to claim 2 wherein said control means controls said second means and said third means in a predetermined sequence.

6. In a seismic data acquisition system wherein seismic data signals are received, converted to digital format, processed and fed to a central processing unit, a floating point formatter comprising:
   receiving means connected to the digital converter for receiving serial digital seismic data;
   shifting means connected to said receiving means for shifting said serial digital data a predetermined number of bits;
   exponent means connected to said shift means for determining an exponent representing the number of bits said serial digital data has been shifted by said shifting means;
   means for combining said shifted serial data and said exponent to produce a floating point number; and
   scale means connected to said means for combining for dividing said floating point number by a predetermined value.

7. The formatter according to claim 6 also including control means for controlling said shifting means and said exponent means.

8. The formatter according to claim 7 wherein said control means includes means for changing said exponent.

9. The floating point formatter according to claim 7 also including:
   means for determining status information.

10. The formatter according to claim 7 wherein said control means is preprogrammed to select any one of a plurality of floating point formats.

11. The formatter according to claim 7 wherein said receiving means includes means for selecting data from one of a plurality of sources.

12. A method for converting serial fixed point digital data into floating point format comprising the steps of:
    receiving fixed point serial digital data;
    scaling said fixed point serial digital data to remove bias;
    shifting said serial digital data a predetermined number of bits;
    determining an exponent representing the number of bits said serial digital data has been shifted;
    combining said shifted serial digital data and said exponent to obtain a floating point number; and
    dividing said floating point number by a predetermined value to permit stacking.

13. The method according to claim 12 also including the step of:
    controlling said shifting step and said determining step to modify said predetermined number and said exponent.

* * * * *